(12) United States Patent
Amemiya

(10) Patent No.: US 7,708,899 B2
(45) Date of Patent: *May 4, 2010

(54) METHOD FOR FORMING MICRO LENSES

(75) Inventor: Hiroki Amemiya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1376 days.

This patent is subject to a terminal disclaimer.

(21) Appl. No.: 10/944,004

(22) Filed: Sep. 20, 2004

(65) Prior Publication Data

US 2005/0061772 A1 Mar. 24, 2005

(30) Foreign Application Priority Data

Sep. 24, 2003 (JP) ............................. 2003-332353

(51) Int. Cl.
*H01L 27/14* (2006.01)
*G02B 3/00* (2006.01)

(52) U.S. Cl. ......................................... 216/26; 430/321
(58) Field of Classification Search ........................ None
See application file for complete search history.

(56) References Cited

U.S. PATENT DOCUMENTS

| 5,433,823 | A | * | 7/1995 | Cain ........................... 438/702 |
| 5,500,077 | A | | 3/1996 | Nishibayashi et al. |
| 5,705,025 | A | * | 1/1998 | Dietrich et al. ............... 438/29 |
| 5,969,388 | A | * | 10/1999 | Kishi ........................ 257/350 |
| 6,137,634 | A | * | 10/2000 | Li ............................... 359/619 |
| 6,316,297 | B1 | * | 11/2001 | Matsuda ..................... 438/174 |
| 6,376,386 | B1 | * | 4/2002 | Oshima ....................... 438/714 |
| 6,441,359 | B1 | * | 8/2002 | Cozier et al. ................. 250/216 |
| 6,562,523 | B1 | * | 5/2003 | Wu et al. ........................ 430/5 |
| 6,569,773 | B1 | * | 5/2003 | Gellrich et al. ............. 438/706 |
| 6,861,280 | B2 | * | 3/2005 | Yamamoto ................... 438/70 |
| 6,864,143 | B1 | * | 3/2005 | Shue et al. .................. 438/299 |
| 2001/0009177 | A1 | * | 7/2001 | Luo et al. ..................... 156/345 |
| 2001/0010597 | A1 | * | 8/2001 | Hamanaka et al. .......... 359/619 |
| 2001/0010952 | A1 | * | 8/2001 | Abramovich ............... 438/151 |
| 2002/0109899 | A1 | * | 8/2002 | Ohtaka et al. ............... 359/245 |
| 2002/0131022 | A1 | * | 9/2002 | Shibatani et al. .............. 353/31 |
| 2002/0158041 | A1 | * | 10/2002 | Maeno et al. .................. 216/2 |
| 2003/0096176 | A1 | * | 5/2003 | Miyamae et al. .............. 430/5 |
| 2004/0146807 | A1 | * | 7/2004 | Lee et al. ..................... 430/311 |
| 2005/0248261 | A1 | * | 11/2005 | Hubert et al. ............... 313/500 |
| 2006/0043068 | A1 | * | 3/2006 | Amemiya et al. ............. 216/67 |

FOREIGN PATENT DOCUMENTS

JP 07-041388 2/1995

* cited by examiner

*Primary Examiner*—Allan Olsen
(74) *Attorney, Agent, or Firm*—Oblon, Spivak, McClelland, Maier & Neustadt, L.L.P.

(57) ABSTRACT

A method for forming micro lenses includes the step of performing an etching treatment to an object to be processed, which includes a lens material layer and a mask layer having lens shapes and formed on the lens material layer, using an etching gas including $SF_6$ gas and $CHF_3$ gas, an etching gas including $SF_6$ gas and CO gas, an etching gas including a gas having therein carbon and fluorine and CO gas, or an etching gas including two or more kinds of gases from a first gas having therein carbon and fluorine and a second gas having therein carbon and fluorine, to etch the lens material layer and the mask layer and transfer the lens shapes of the mask layer to the lens material layer, thereby forming the micro lenses.

7 Claims, 23 Drawing Sheets

ETCHING GAS INCLUDING $SF_6$ AND $CHF_3$

ETCHING GAS INCLUDING CxFy AND CO

ETCHING GAS INCLUDING $C_{x1}F_{y1}$ AND $C_{x2}F_{y2}$

MASK LAYER $SF_6$ /$CHF_3$ = 60sccm / 60sccm
2.67 Pa

SF6 /CHF3 = 60sccm / 75sccm
2.67 Pa

SF6 /CHF3 = 60sccm / 60sccm
5.33 Pa

MASK LAYER

CF4 /CO = 60sccm / 60sccm

CF4 /CO = 30sccm / 90sccm

CF4 : 60 sccm

CF4 /O2 = 30 sccm / 8 sccm

LH : 656 nm
LW: 2700 nm 206 nm

C₃F₈ / C₄F₈ = 35 sccm / 10 sccm

LH : 656 nm
LW: 2656 nm 252 nm

C₃F₈ / C₄F₈ = 40 sccm / 5 sccm

LH : 643 nm
LW: 2604 nm 291 nm

CF₄ : 60 sccm

METHOD FOR FORMING MICRO LENSES

FIELD OF THE INVENTION

The present invention relates to a method for forming micro lenses; and, more particularly, to a method for forming micro lenses that are used as, e.g., on-chip lenses for use in such devices as a charge coupled device (CCD) or a liquid crystal display (LCD) device.

BACKGROUND OF THE INVENTION

Micro lenses for a CCD are formed, e.g., by performing the steps of: forming a mask layer 11, out of a resist film, to have specific lens shapes on a lens material layer 10, which is made of a lens material such as an $Si_3N_4$ film; and then etching both the mask layer 11 and the lens material layer 10 to transfer the lens shapes of the mask layer 11 to the lens material layer 10, as shown in FIG. 24. Conventionally, in the etching step, the lens material layer 10 and the mask layer 11 are etched in a selectivity of 1:1, whereby the lens shapes of the mask layer 11 are precisely transferred to the lens material layer 10.

Normally, the shape of a micro lens is defined by the curvature, the height, and the width thereof wherein the width is a diameter of the lens from a horizontal viewpoint. Further, it is possible to form a desired lens shape by controlling various process parameters. Meanwhile, for the purpose of improving a sensitivity by increasing the light collection efficiency in terms of an uppermost surface lens of a CCD, it is required to enlarge an area of the lens, whereby more light can be collected on a condensing point. For this reason, it is preferred to enlarge a lens width by reducing a distance A between adjacent lenses.

However, the lens shapes of the mask layer 11 are formed in a photolithography process, which limits the ability to minimize of a distance B between adjacent lens shapes. That is to say, the minimum of the distance B is 0.2 to 0.3 μm and cannot be reduced further because adjacent resist films adhere to each other due to a surface tension thereof in the course of a heat treatment during the photolithography process.

Consequently, the present inventors have endeavoured to establish a method for forming micro lenses whose shapes are different from the lens shapes of the mask layer 11 by controlling a selectivity between the lens material layer 10 and the mask layer 11 during an etching process. In this connection, Japanese Patent Laid-Open Application No. 2000-164837 (hereinafter, referred to as "reference 1") discloses a method for forming an in-layer lens with a thickness different from that of a lens shape of a resist layer by etching a lens material layer and the resist with the lens shape using an etching gas including $SF_6$ gas and $O_2$ gas, and controlling a ratio of the flow rates of the $SF_6$ gas and the $O_2$ gas; and Japanese Patent Laid-Open Application No. 2002-110952 (hereinafter, referred to as "reference 2") discloses a method for forming on-chip lenses with large widths and narrowing a distance between adjacent lenses by etching a lens material layer and a resist film, where the lens shapes are formed, using an etching gas including $CF_4$ and $O_2$.

However, the method of reference 1 has a disadvantage in that the width of the resulting lens becomes rather small, because the etching gas includes $O_2$. It is presumed that oxygen facilitates an etching of the resist film that is an organic film, whereby the lens shape of the resist becomes smaller and the reduced lens shape of the resist is transferred, to produce a smaller lens. For this reason, this method suffers from the lack of controllability over a lens area. Further, although this method can control the thickness of the lens, it cannot form a lens with a large width.

Further, the method of reference 2 has a problem in that an in-surface uniformity of an etching rate becomes lower in case the lens material layer is an inorganic film. Furthermore, the method of reference 2 has the same problem as that of reference 1 in that it is difficult to form a lens with a large width because the etching gas includes $O_2$.

SUMMARY OF THE INVENTION

It is, therefore, an object of the present invention to provide a method for forming micro lenses, wherein an etching rate, an in-surface uniformity, and a lens shape can be controlled by adjusting a ratio of the flow rates of two kinds of gases employed as the etching gas.

In accordance with a preferred embodiment of the present invention, there is provided a method for forming micro lenses, including the step of performing an etching treatment on an object to be processed, which includes a lens material layer and a mask layer having lens shapes and formed on the lens material layer, using an etching gas including $SF_6$ gas and $CHF_3$ gas or an etching gas including $SF_6$ gas and CO gas, to etch the lens material layer and the mask layer and transfer the lens shapes of the mask layer to the lens material layer, thereby forming the micro lenses. Here, the lens material layer is, e.g., a silicon nitride film, and the mask layer is, e.g., a resist film. The silicon nitride film is a film including silicon Si and nitrogen N, and a main component thereof is thought to be $Si_3N_4$. Hereinafter, the silicon nitride film is referred to as a SiN film.

In accordance with another preferred embodiment of the present invention, there is provided a method for forming micro lenses, including the step of performing an etching treatment on an object to be processed, which includes a lens material layer and a mask layer having lens shapes and formed on the lens material layer, using an etching gas including a gas having therein carbon and fluorine and CO gas, to etch the lens material layer and the mask layer and transfer the lens shapes of the mask layer to the lens material layer, thereby forming the micro lenses. Here, the gas having therein carbon and fluorine may be a gas selected from the group consisting of $CF_4$ gas, $C_2F_6$ gas and $C_3F_8$ gas; the lens material layer is, e.g., a resin based organic film, and the mask layer is, e.g., a resist film.

In accordance with a further preferred embodiment of the present invention, there is provided a method for forming micro lenses, including the step of performing an etching treatment on an object to be processed, which includes a lens material layer and a mask layer having lens shapes and formed on the lens material layer, using an etching gas including two or more kinds of gases selected from a first gas having therein carbon and fluorine and a second gas having therein carbon and fluorine, to etch the lens material layer and the mask layer and transfer the lens shapes of the mask layer to the lens material layer, thereby forming the micro lenses. Here, the first gas is a gas having therein carbon and fluorine whose carbon number is equal to or less than 3, for example, $CF_4$, $C_2F_6$ and $C_3F_8$; and the second gas, equal to or greater than 4, for example, $C_4F_6$, $C_4F_8$ or $C_5F_8$. And, the lens layer is, e.g., a resin based organic film, and the mask layer is, e.g., a resist film.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
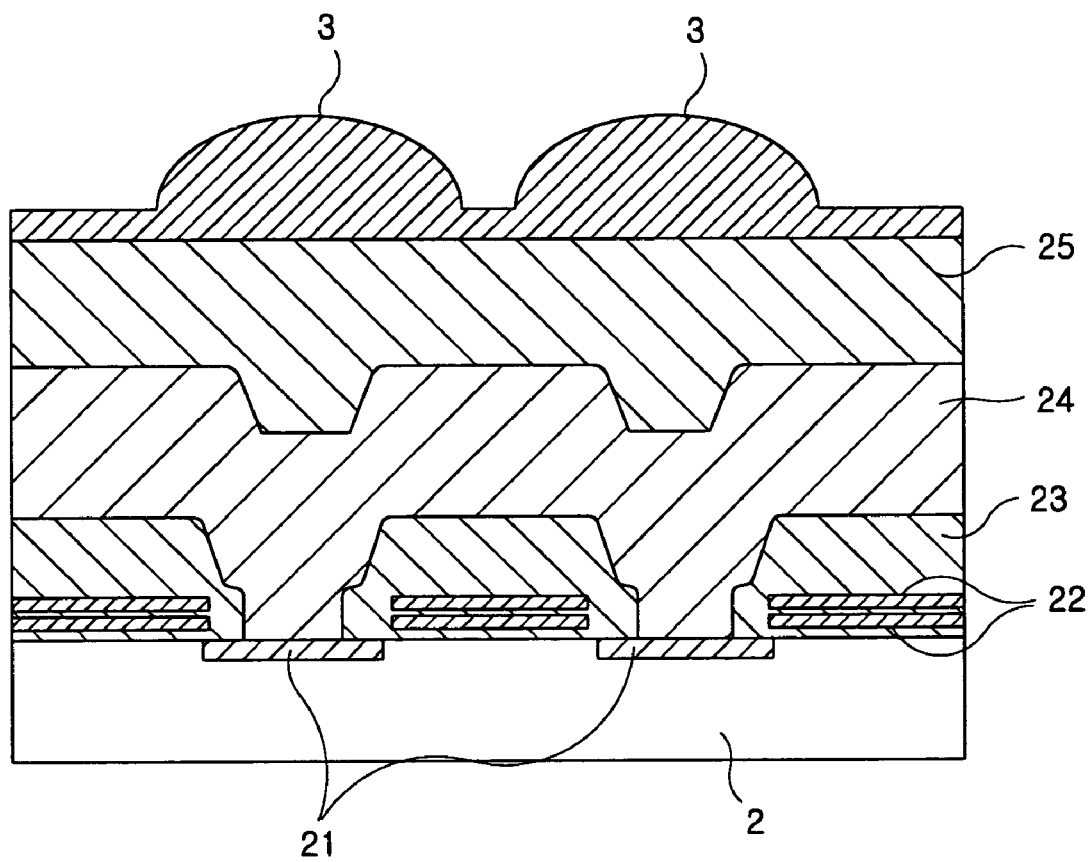
FIG. 1 shows a cross section of an exemplary CCD including micro lenses in accordance with the present invention.

First, an exemplary configuration of a CCD including micro lenses formed in accordance with the present invention is explained with reference to FIG. 1. A semiconductor substrate 2 includes photosensitive units 21 arranged in a matrix shape on a surface thereof, and rays incident on the photosensitive units 21 are photoelectrically converted by photodiodes. A conductive film 22, which forms a transfer electrode made of, e.g., polysilicon, is prepared on an area of the semiconductor substrate 2 where the photosensitive units 21 do not exist, and a shading film 23 made of, e.g., aluminum is formed on an upper area of the conductive film 22.

The shading film 23 is designed to suppress an incidence of rays on the conductive film 22 while the photosensitive units 21 receive the incident rays. Accordingly, openings are formed at an area of the shading film 23 corresponding to the photosensitive units 21, to pass incident rays therethrough. A planarization film 24 made of, e.g., a polyimide based resin or a polystyrene based resin is formed on the shading film 23.

A color filter layer 25 is formed on the planarization film 24, and micro lenses 3 made of, e.g., an SiN film are formed on an area of the color filter layer 25 corresponding to the photosensitive units 21. The micro lenses 3 are designed to collect light into the photosensitive units 21 and, therefore, are formed to have an area larger than that of the photosensitive units 21 in order to collect light on a wider area. The micro lenses are arranged in, e.g., a honeycomb structure.

Figure 2A:
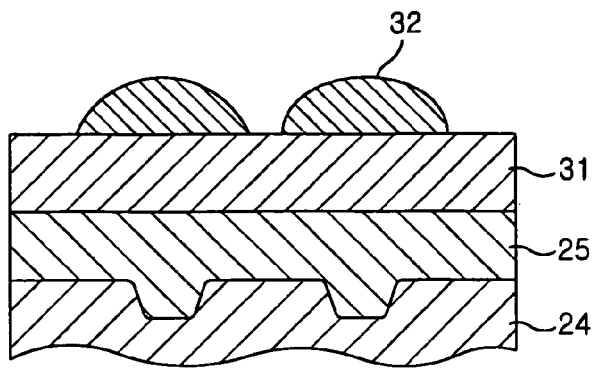
FIGS. 2A to 2C illustrate the method of forming micro lenses in accordance with a first preferred embodiment of the present invention.

A first preferred embodiment of the inventive method for forming the micro lenses 3 will now be described with reference to FIGS. 2A to 2C. First, on a semiconductor substrate 2 of a CCD, photosensitive units 21 are formed. Thereafter, a conductive film 22 and a shading film 23 are formed thereon. Next, a planarization film 24 and a color filter layer 25 are formed thereon sequentially. And then, as shown in FIG. 2A, for example, a lens material layer 31 made of a SiN film is formed on the color filter layer 25 by, e.g., a CVD method to have a thickness of, e.g., 1 μm. Subsequently, a mask layer 32 made of, e.g., a KrF resist film or an i-line resist film is formed to have a specific lens shape on the lens material layer 31. Specifically, after the mask layer 32 is formed, it is patterned in a photolithography process, and then is heat-treated to have the lens shapes.

Figure 2B:
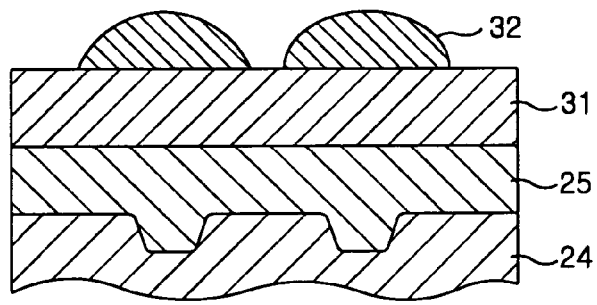
Figure 2C:
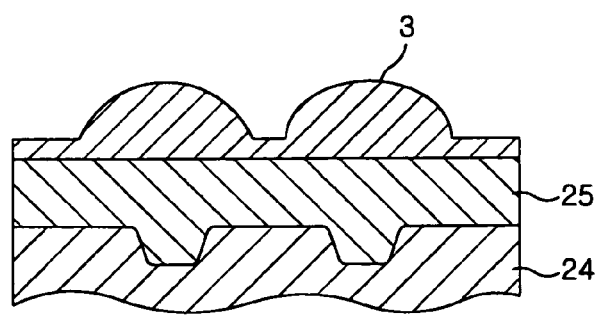

Then, the mask layer 32 and the lens material layer 31 are etched simultaneously using an etching gas including $SF_6$ and CHF$_3$ as shown in FIG. 2B, whereby the lens shapes of the mask layer 32 are transferred to the lens material layer 31, to form micro lenses 3 with specific shapes as shown in FIG. 2C.

Since the above-described etching process is a key feature of the present invention, the etching process will now be explained in detail. First, a magnetron RIE plasma etching apparatus, which is used as an apparatus for performing the etching process, will be explained with reference to FIG. 3. Reference numeral 4 indicates a cylindrical and airtightly sealed processing chamber with a wall made of, e.g., aluminum. The processing chamber 4, which is grounded, includes an upper room 4A and a lower room 4B, the latter being larger than the upper room 4A.

The processing chamber 4 includes therein a mounting table 41, which also works as a lower electrode, for supporting substantially horizontally a semiconductor wafer (hereinafter, referred to as wafer) that is an object to be processed. The mounting table 41 is made of, e.g., aluminum. Further, an electrostatic chuck 42 is installed on a surface of the mounting table 41 to support by adsorbing to the wafer W by virtue of an electrostatic adsorptive force. Reference numeral 42a represents a power supply unit for the electrostatic chuck 42. A focus ring 43 is installed around the wafer W prepared on a surface of the electrostatic chuck 42. The mounting table 41 is supported by a support unit 45, which is made of a conductor, via an insulating plate 44. The surface of the mounting table 41 can be vertically moved up and down between a mounting position located in the lower room 4B and a processing position shown in FIG. 3 by an elevating mechanism that is, e.g., a ball screw mechanism 46, via the support unit 45. A bellows 47 is made of, e.g., a stainless steel, and the support unit 45 is coupled with the processing chamber 4 through the bellows 47.

In the mounting table 41, there is formed a coolant passageway 48 through which a coolant passes, whereby a surface temperature of the mounting table 41 is controlled to be, e.g., about 40° C. Further, the wafer W is controlled to be at a specific temperature, e.g., about 100° C., by virtue of the temperature of the mounting table 41 and a heat input from a plasma. A gas channel 49 is designed to supply a backside gas as a cooling gas between the electrostatic chuck 42 on the mounting table 41 and a backside of the wafer W, whereby the wafer is efficiently cooled down even if an inner space of the processing chamber 4 is maintained in a vacuum, which will be described later.

Figure 3:
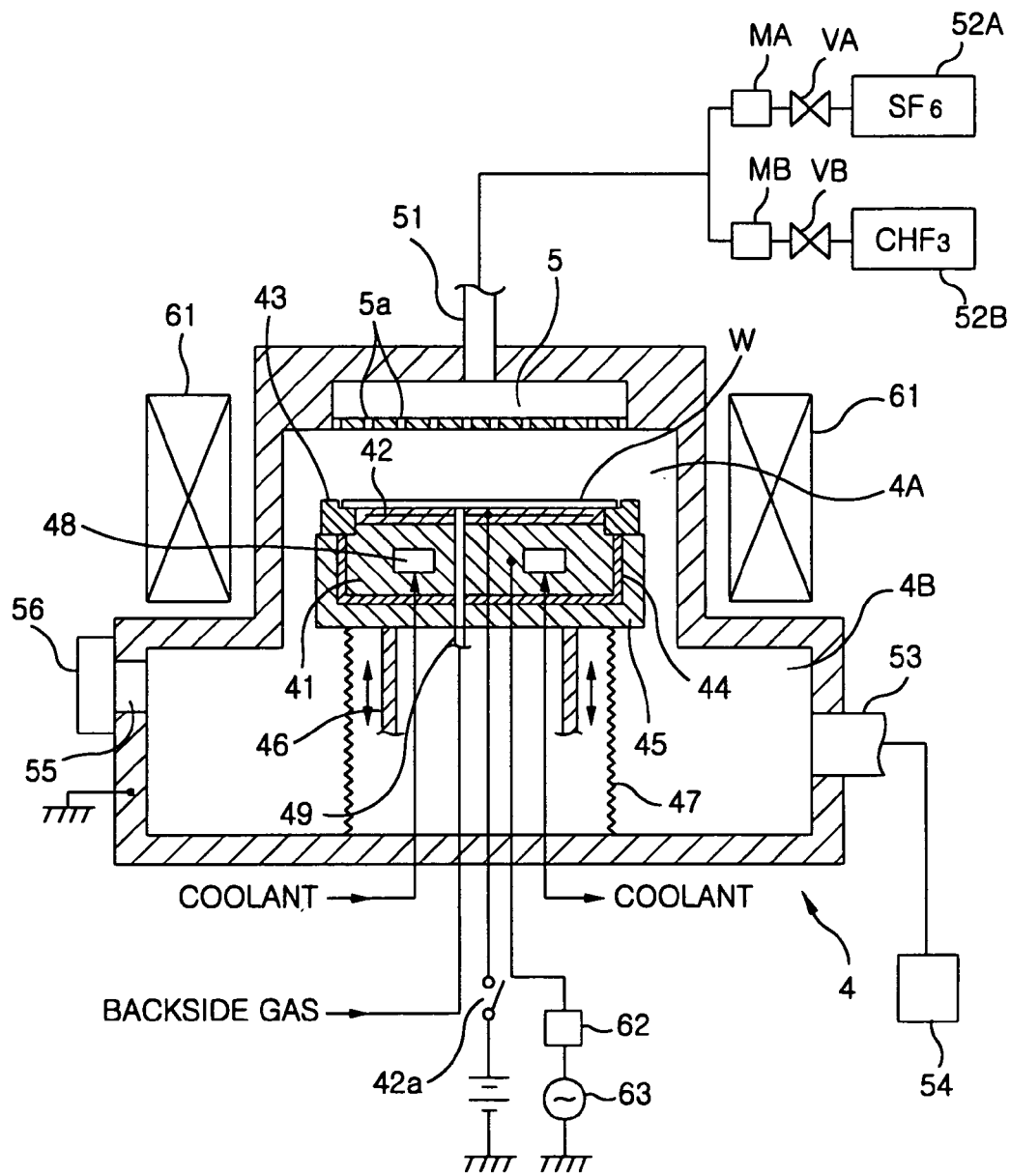
FIG. 3 describes the configuration of an exemplary magnetron RIE plasma etching apparatus for executing an etching of a mask layer and a lens material layer for the micro lenses.

In a ceiling wall portion of the processing chamber 4, which faces the mounting table 41, there exists a gas supply chamber 5 that is grounded and works also as an upper electrode. A plurality of gas discharge openings 5a are formed at a bottom surface of the gas supply chamber 5, and etching gas sources, e.g., an SF$_6$ gas source 52A and a CHF$_3$ gas source 52B, are respectively coupled with a top surface of the gas supply chamber 5 through a gas supply line 51. With reference to FIG. 3, notations MA and MB indicate mass flow controllers, and notations VA and VB represent valves. In this way, SF$_6$ and CHF$_3$ are supplied from the gas discharge openings 5a to the mounting table 41 through the gas supply chamber 5, substantially uniformly over the entire mounting surface of the mounting table 41.

Around the upper room 4A of the processing chamber 4, a dipolar ring magnet 61 including a multitude of columnar anisotropic segment magnets is arranged. Further, a high frequency power supply unit 63 for forming a plasma is coupled with the mounting table 41 via a matching unit 62, and a high frequency power of a specific frequency, e.g., 13.56 MHz is supplied from the high frequency power supply unit 63 to the mounting table 41. In this way, the gas supply chamber 5 and the mounting table 41 function as a pair of electrodes. An inner space of the processing chamber 4 is exhausted to a specific vacuum level by a vacuum exhaust unit 54 via a gas exhaust line 53. Reference numeral 55 indicates a loading/unloading port for a wafer, and reference numeral 56 indicates a gate valve to open/close the loading/unloading port.

An etching treatment performed in the plasma etching apparatus will now be explained. First, a wafer W, on a surface of which a CCD including a lens material layer 31 and a mask layer 32 as shown in FIG. 2A is formed, is loaded through the loading/unloading port 55 and is placed on the mounting table 41 in a mounting position. Next, the mounting table 41 is elevated to a processing position, and the vacuum exhaust unit 54 removes air from the processing chamber 4 to a specific vacuum level. Thereafter, an etching gas of, e.g., SF$_6$ gas and CHF$_3$ gas is introduced from the gas supply chamber 5 at a specific ratio of the flow rates.

Meanwhile, a specific high frequency power is supplied from the high frequency power supply unit 63 to the mounting table 41. Thereby, a high frequency electric field is formed between the gas supply chamber 5, which is the upper electrode, and the mounting table 41, which is the lower electrode. Since a horizontal magnetic field is formed in the upper room 4A by the dipolar ring magnet 61, an orthogonal electromagnetic field is formed in a processing space where the wafer W exists, and thus a magnetron discharge occurs due to an electron drift generated by the orthogonal electromagnetic field. Further, the etching gas is transformed into a plasma due to the magnetron discharge, and the lens material layer 31 and the mask layer 32 on the wafer W are etched by the plasma.

In the etching treatment described above, the flow rate of the SF$_6$ gas is preferably set to be about 10 sccm to 200 sccm, and the ratio of the flow rates of the SF$_6$ gas and the CHF$_3$ gas is preferably controlled so that the ratio of SF$_6$:CHF$_3$ ranges from 10:1 to 10:200. Further, the pressure in the processing chamber 4 is preferably set to be about 1.33 Pa to 26.6 Pa as described in the following experiments in accordance with the first preferred embodiment; the temperature of the mounting table 41, about 0° C. to 60° C.; the high frequency power, about 100 W to 1000 W; and the magnetic field, about 60 G to 120 G.

Figure 4:
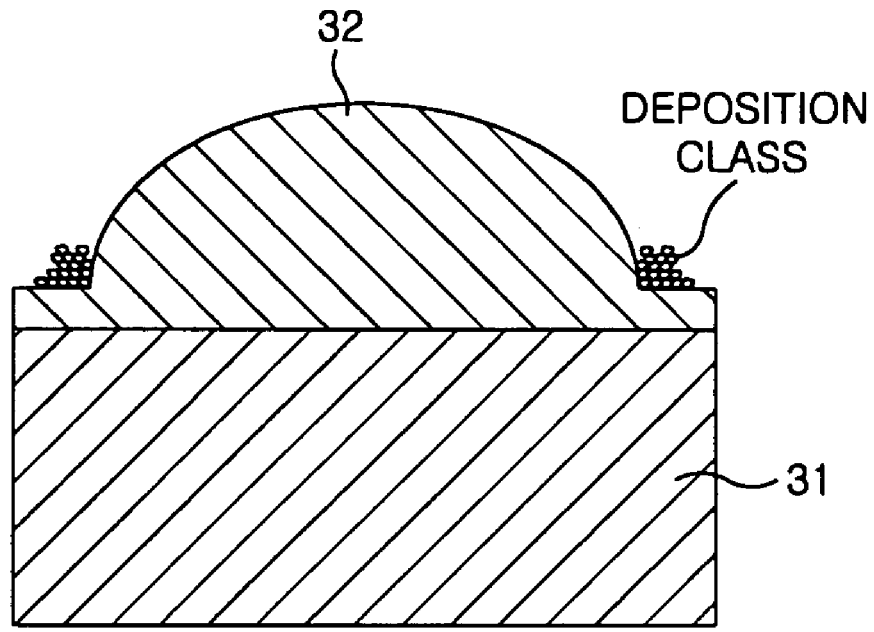
FIG. 4 offers cross sectional views to demonstrate the deposition of C and others in the course of an etching process.
Figure 4:
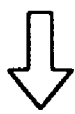
Figure 4:
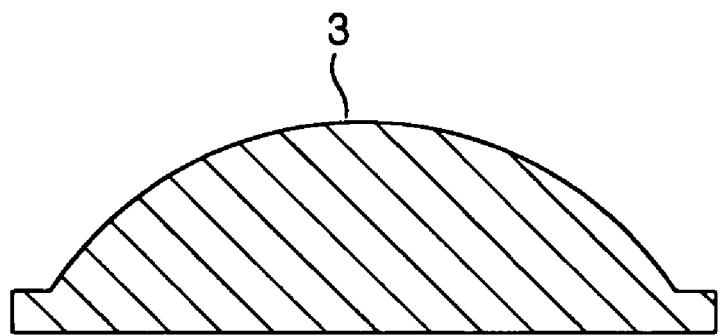

In the etching treatment, among the by-products generated from SF$_6$ gas and CHF$_3$ gas, F works as an etching class, while C, CF, CF$_2$, CF$_3$ and et al. (hereinafter, called "C and others") work as a deposition class. Herein, the etching proceeds while an etching by F and a deposition by C and others occur concurrently. C and others, i.e., the deposition class, are deposited at a peripheral area of the lens shape of the mask layer 32 as shown in FIG. 4. Consequently, the width of the lens shape of the mask layer 32 becomes larger due to the deposition. Thereafter, the mask layer 32 is transferred to the lens material layer 31, such that micro lenses 3 with a large width are formed to have a same curvature of a central area as that of the lens shapes of the mask layer 32.

Therefore, by controlling the amounts of F, C and others while controlling the ratio of the flow rates of the SF$_6$ gas and the CHF$_3$ gas, it is possible to control the etching rate, in-surface uniformity, selectivity and the like, as will be described more specifically in the following experiments in accordance with the first preferred embodiment. In particular, if the flow rate of the SF$_6$ gas and the amount of F become large, the etching rate becomes larger. Further, since the lens material layer 31 and the mask layer 32 are made of different kinds of films, i.e., a SiN film and a resist film, respectively, the etching rates by F thereof are different from each other, which makes it possible to control the selectivity by controlling the amount of F. Further, if the flow rate of the $CHF_3$ gas becomes large and thus the amount of the deposition class such as C and others increases, the in-surface uniformity can be improved and the micro lenses having a large width can be formed; however the etching rate thereof is decreased due to a lowered etching capability of F.

Figure 5A:
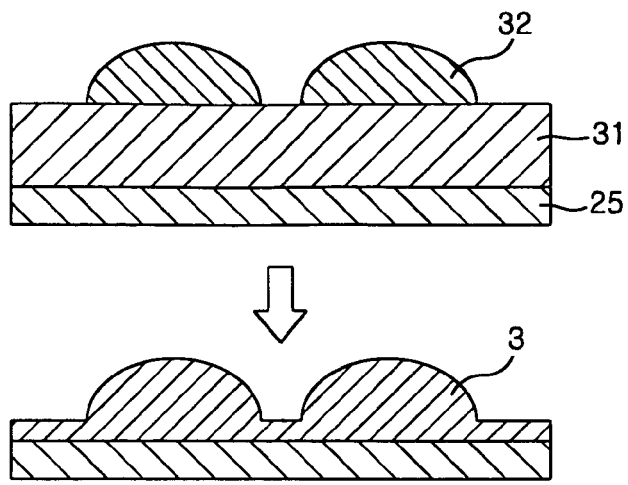
FIGS. 5A to 5C provide cross sectional views to explain how the etching process works.
Figure 5B:
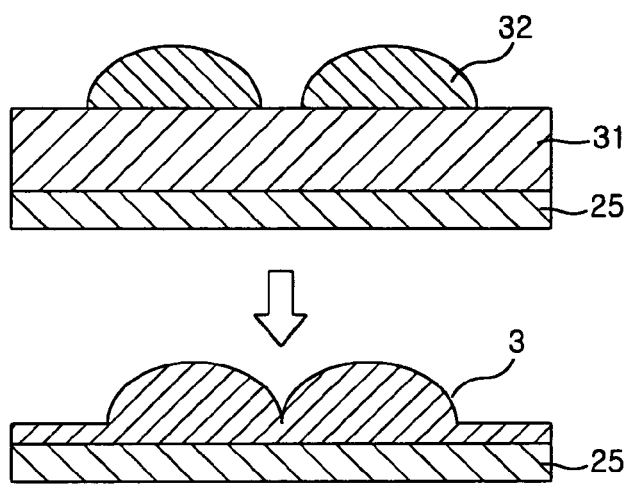
Figure 5C:
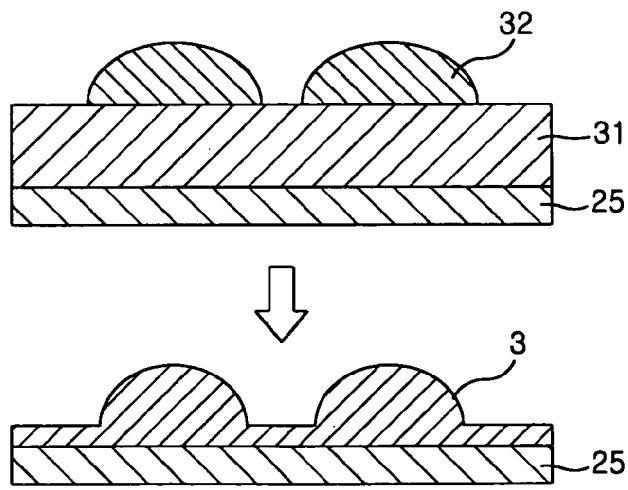

For instance, by controlling the ratio of the flow rates of the $SF_6$ gas and the $CHF_3$ gas, it is possible: to transfer the lens shapes of the mask layer 32 to the lens material layer 31 with a selectivity of 1:1 as shown in FIG. 5A; to transfer the lens shapes of the mask layer 32 to the lens material layer 31 with a selectivity of 1:1 to 1:1.5, to form micro lenses having a width larger than that of the lens shapes of the mask layer 32; and to transfer the lens shapes of the mask layer 32 to the lens material layer 31 with a selectivity of 1:1 to 1:0.5, to form micro lenses having a width smaller than that of the lens shapes of the mask layer 32.

Further, by combining the $SF_6$ gas with the $CHF_3$ gas and controlling the ratio of the flow rates thereof, the in-surface uniformity can be improved as described above. That is, it is presumed that since a plasma of the $SF_6$ gas has an uneven density while a plasma of the $CHF_3$ gas is diffused uniformly, by combining them, a plasma of the $SF_6$ gas is diffused by virtue of the $CHF_3$ gas and thus is supplied uniformly over the surface of the wafer. On the other hand, when $CF_4$ gas is combined with $CHF_3$ gas, it is presumed that since a plasma density of the $CF_4$ gas is predicted to be uniform, by adding thereto the $CHF_3$ gas, the plasma density profile thereof will lack uniformity, which may result in a deterioration of the in-surface uniformity.

As described above, in accordance with the first preferred embodiment, by controlling the ratio of the flow rates of the $SF_6$ gas and the $CHF_3$ gas, it is possible to control the etching rate, the in-surface uniformity and the selectivity. Further, by controlling the selectivity, it is possible to control the lens height and the lens width to adjust the lens shape. Accordingly, even in case of using the mask layer 32 having fixed lens shapes, there can be formed sets of micro lenses 3 whose lens shapes, such as height, curvature and width, are different from each other. As shown above, by employing the method in accordance with the first preferred embodiment, it is possible to form micro lenses 3 with lens shapes different from those of the mask layer 32, with a high degree of freedom of choosing the shapes of the micro lenses 3. Therefore, it is also possible to form micro lenses 3 having a width larger than that of the lens shapes of the mask layer 32 as well as an extremely small distance, i.e., about 0 to 0.1 μm, between adjacent lenses. The micro lenses 3 having the above features have a high degree of condensing light into the photosensitive unit 21, whereby a high sensitivity can be acquired.

Furthermore, in accordance with the first preferred embodiment, CO gas may be used instead of the $CHF_3$ gas. In this case, by controlling the ratio of the flow rates of the $SF_6$ gas and the CO gas, it is possible to control the etching rate, the in-surface uniformity and the selectivity, whereby the lens shape is controlled. Similarly, one of such gases as $CH_3F$, $CH_2F_4$, $CH_2F_2$, $NH_3$, $CO_2$, $Cl_2$, $CF_4$, $C_2F_6$, $C_3F_8$, $C_4F_8$, $C_5F_8$ and $C_4F_6$ may be employed instead of the $CHF_3$ gas, which may facilitate deposition in the etching treatment.

Figure 6A:
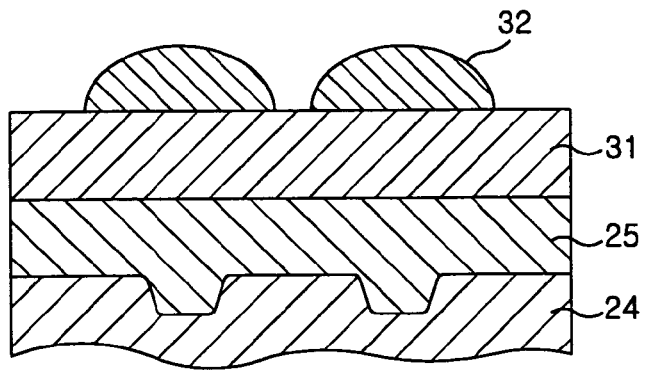
FIGS. 6A to 6C illustrate the method of forming micro lenses in accordance with a second preferred embodiment of the present invention.
Figure 6B:
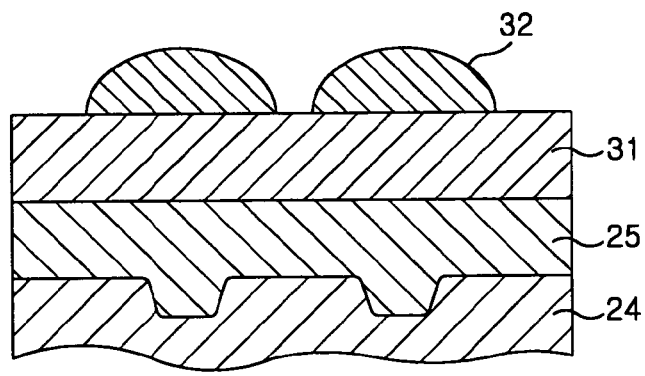
Figure 6C:
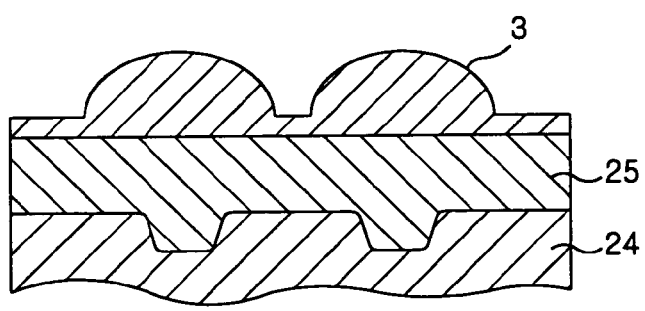

In the ensuing discussion, a second preferred embodiment in accordance with the present invention will be explained. The second preferred embodiment employs a resin based organic film, such as an i-line resist film, as a lens material layer 31; and a resist film, such as an i-line resist film or a KrF resist film, as a mask layer 32 as shown in FIGS. 6A to 6C. Further, micro lenses 3 are formed by etching the lens material layer 31 and the mask layer 32 using an etching gas including CxFy gas, which includes carbon and fluorine therein, and CO gas as shown in FIGS. 6A to 6C. The CxFy gas may be, e.g., $CF_4$, $C_2F_6$ or $C_3F_8$.

In the etching treatment, the flow rate of the CxFy gas is preferably set to be about 10 sccm to 200 sccm, and the ratio of the flow rates of CxFy and CO is preferably controlled so that the ratio of CxFy:CO ranges from 10:1 to 10:200. Further, the pressure in the processing chamber 4 is preferably set to be about 1.33 Pa to 26.6 Pa; the temperature of the mounting table 41, about 0° C. to 60° C.; the high frequency power, about 100 W to 1000 W; and the magnetic field, about 60 G to 120 G.

In the etching treatment, F and O, in the CxFy gas and the CO gas, work as an etching class, while C, CF, $CF_2$ and $CF_3$ work as a deposition class. Accordingly, the etching proceeds while an etching by F and O and a deposition by C and others occur concurrently. In case both the lens material layer 31 and the mask layer 32 are made of a same kind of film, the selectivity thereof becomes 1:1, and the lens height and the lens width will be controlled by the amount of deposition of C and others. In case the lens material layer 31 and the mask layer 32 are made of different kinds of films from each other, the selectivity will not be even, and the lens height and the lens width may be controlled by adjusting the selectivity.

In accordance with the second preferred embodiment, therefore, it is also possible to control the etching rate, the in-surface uniformity and the selectivity by controlling the amount of F and C and others while controlling the ratio of the flow rates of the CxFy gas and the CO gas, whereby the lens height and the lens width can be adjusted. Accordingly, even in case a mask layer 32 having fixed lens shapes is used, micro lenses 3 having a desired height, a desired curvature and a desired width can be formed. The micro lenses 3 formed as shown above have a high degree of freedom of choosing the shape thereof, and, therefore, it is possible to form micro lenses 3 having, e.g., a width larger than that of the lens shapes of the mask layer 32.

Figure 7A:
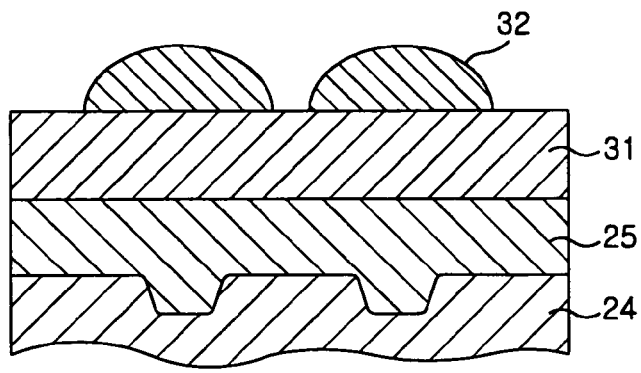
FIGS. 7A to 7C depict the method of forming micro lenses in accordance with a third preferred embodiment of the present invention.
Figure 7B:
Figure 7B:
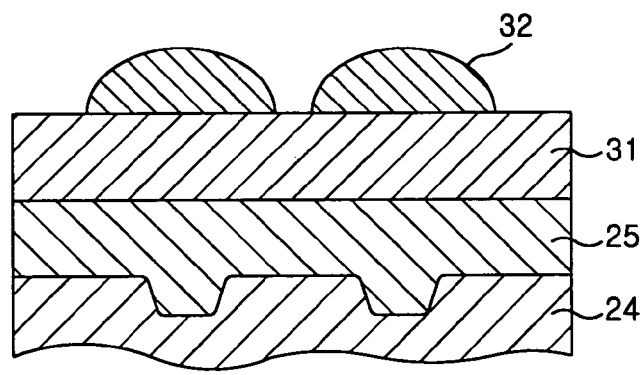
Figure 7C:
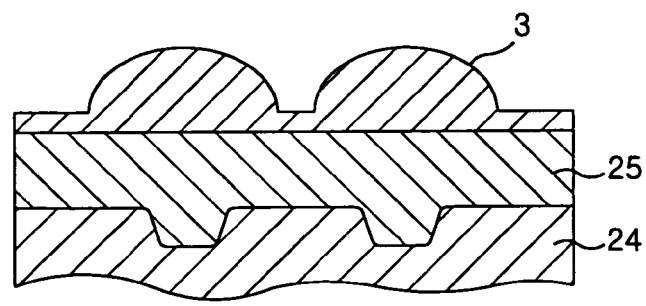

A third preferred embodiment in accordance with the present invention will now be explained. The third preferred embodiment employs a resin based organic film, such as an i-line resist film, as a lens material layer 31; and a resist film, such as an i-line resist film or a KrF resist film, as a mask layer 32 as shown in FIGS. 7A to 7C. Further, micro lenses 3 are formed by etching the lens material layer 31 and the mask layer 32 using an etching gas including a first gas having carbon and fluorine $(Cx_1Fy_1)$ and a second gas having carbon and fluorine $(Cx_2Fy_2)$ as shown in FIGS. 7A to 7C. The $Cx_1Fy_1$ gas may be a gas having carbon and fluorine wherein carbon number is equal to or lower than 3, such as $CF_4$, $C_2F_6$ and $C_3F_8$. And the $Cx_2Fy_2$ gas may be a higher molecular gas having carbon and fluorine wherein carbon number is equal to or greater than 4, such as $C_4F_6$, $C_4F_8$ and $C_5F_8$.

In the etching treatment, the flow rate of the $Cx_1Fy_1$ gas is preferably set to be about 10 sccm to 200 sccm, that of the $Cx_2Fy_2$ gas is preferably set to be about 1 sccm to 200 sccm, and the ratio of the flow rates of the $Cx_1Fy_1$ gas and the $Cx_2Fy_2$ gas is preferably set so that the ratio of $Cx_1Fy_1$:$Cx_2Fy_2$ ranges from 10:1 to 10:200. Further, the pressure in the processing chamber 4 is preferably set to be about 1.33 Pa to 26.6 Pa; the temperature of the mounting table 41, about 0° C. to 60° C.; the high frequency power, about 100 W to 1000 W; and the magnetic field, about 60 G to 120 G.

In the etching treatment, the $Cx_1Fy_1$ gas is a gas with a high etching rate, and the etching rate thereof increases in the order of $C_4F_6$, $C_5F_8$, $C_4F_8$, $C_3F_8$, $C_2F_6$ and $CF_4$. Further, the $Cx_2Fy_2$ is a gas with a high deposition activity, and the width of the lens formed thereby increases in the order of $CF_4$, $C_2F_6$, $C_3F_8$, $C_4F_8$, $C_5F_8$ and $C_4F_6$. As mentioned above, the $Cx_1Fy_1$ gas has a high etching rate and a low deposition activity while the $Cx_2Fy_2$ gas has a low etching rate and a high deposition activity. It is presumed that this is because the $Cx_1Fy_1$ gas has a straight chain structure, which is easy to be dissociated and to generate F, i.e., an etching class, while the $Cx_2Fy_2$ gas has a cyclo structure or a double bond, which has elements strongly bound and difficult to be dissociated and, therefore, is easier to generate C, CF, $CF_2$, et al., i.e., a deposition class, than to generate an etching class such as F.

In case both the lens material layer 31 and the mask layer 32 are made of a same kind of film, the selectivity thereof is 1:1, and the lens height and the lens width are controlled by the amount of deposition of C and others. In case the lens material layer 31 and the mask layer 32 are made of different kinds of films, the selectivity will not be even, and the lens height and the lens width may be adjusted by controlling the selectivity or the amount of deposition.

In consequence, by controlling the ratio of the flow rates of the $Cx_1Fy_1$ gas and the $Cx_2Fy_2$ gas or by controlling the combination thereof, it is possible to control the etching rate, the selectivity, the lens height or the lens width. Accordingly, also in this preferred embodiment, by using the mask layer 32 having fixed lens shapes, micro lenses 3 with a required lens shape can be formed, and thus, there can be attained a high degree of freedom of choosing the shape of formed micro lenses 3. For instance, it is possible to form micro lenses 3 having a width larger than that of the lens shapes of the mask layer 32, wherein a distance between adjacent lenses becomes lower than 0.2 µm.

Further, by using a high molecular fluorocarbon gas in the preferred embodiment, generation of UV can be reduced. That is, in the course of performing an etching treatment in the plasma etching apparatus, UV is generated while a plasma is being generated, and an electron generated by the UV may remain on a wafer. Meanwhile, a CCD converts a received light image into an electronic signal. Consequently, a dark current problem may occur since the electron generated by the UV has a bad influence upon the electronic signal, thereby lowering the quality of the image.

As described above, in case of employing a high molecular fluorocarbon gas, the amount of UV generated can be considerably reduced and, in particular, the reducing effect increases in the order of $CF_4$, $C_2F_6$, $C_3F_8$, $C_4F_8$ and $C_5F_8$, which will be also described in the following experiments in accordance with this preferred embodiment. It is presumed that this is because the binding between the elements in the high molecular fluorocarbon gas is strong and firm and, therefore, most of the plasma energy is used for electron dissociation, whereby the UV generation can be suppressed. Accordingly, by using $C_5F_8$, $C_4F_8$ or $C_3F_8$ as the $Cx_2Fy_2$ gas, the amount of the UV generated in the plasma etching apparatus can be reduced. As a result, a dark current in a CCD can be reduced.

Hereinafter, experiments for verifying the beneficial effects of the present invention will be explained. As described above, the first preferred embodiment is a process using $SF_6$ gas and $CHF_3$ gas; the second preferred embodiment is a process using CxFy gas and CO gas; and the third preferred embodiment is a process using $Cx_1Fy_1$ gas and $Cx_2Fy_2$ gas. The plasma etching apparatus shown in FIG. 3 is used as the etching apparatus.

In a first experiment in accordance with the first preferred embodiment, a P—SiN film and a KrF resist film were employed as the lens material layer 31 and the mask layer 32, respectively. Further, while etching the lens material layer 31 and the mask layer 32 using an etching gas including the $SF_6$ gas and the $CHF_3$ gas, the etching rates of the lens material layer 31 and the mask layer 32 were measured. For the etching operation, the flow rates of both the $SF_6$ gas and the $CHF_3$ gas were set at 60 sccm, the temperature of the mounting table 41 was 40° C., the pressure was 2.66 Pa, the high frequency power was 400 W, and the magnetic field was 120 G. Further, a first comparative experiment was performed with the identical etching conditions except that $CF_4$ gas (60 sccm) was used as the etching gas.

Figure 8A:
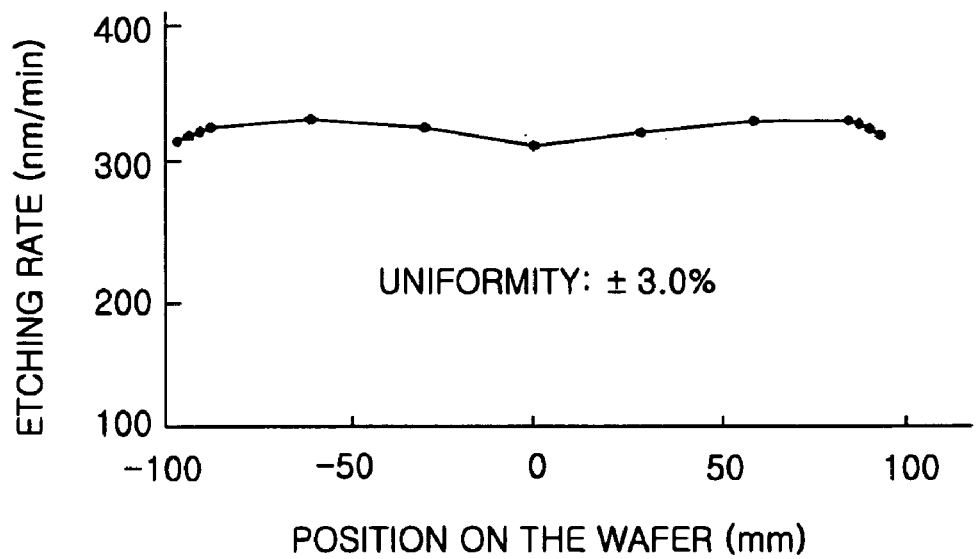
FIGS. 8A and 8B offer etching rate characteristic diagrams showing a result of a first experiment in accordance with the first preferred embodiment of the present invention.
Figure 8B:
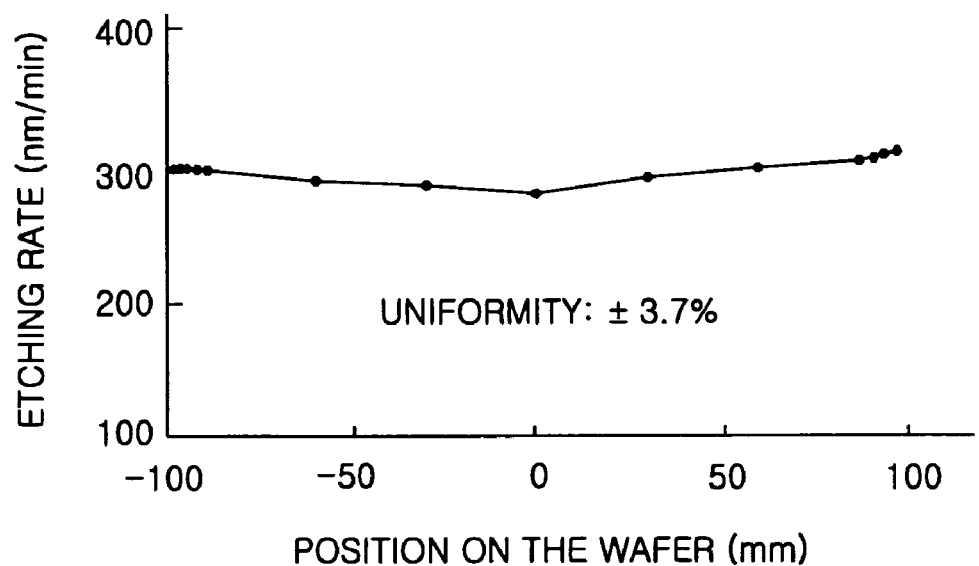
Figure 9A:
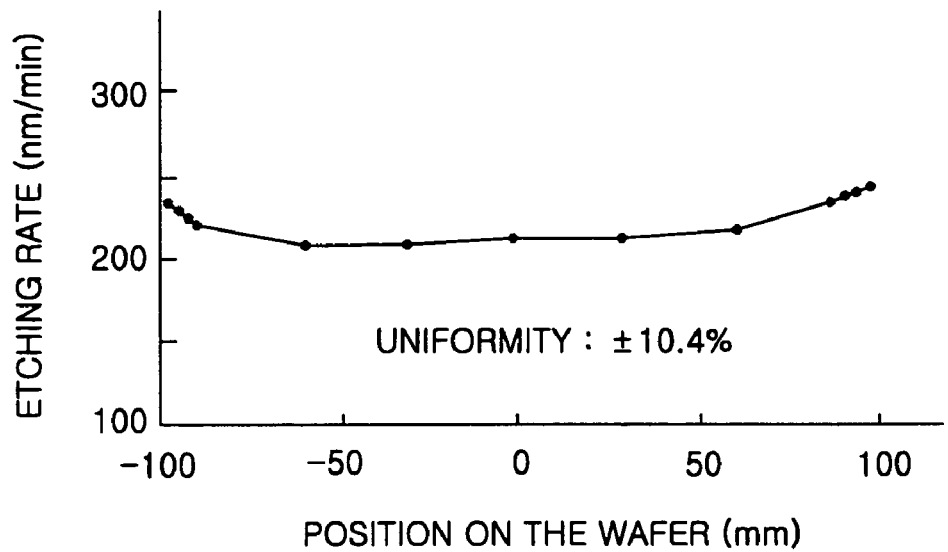
FIGS. 9A and 9B present etching rate characteristic diagrams showing a result of a first comparative experiment.
Figure 9B:
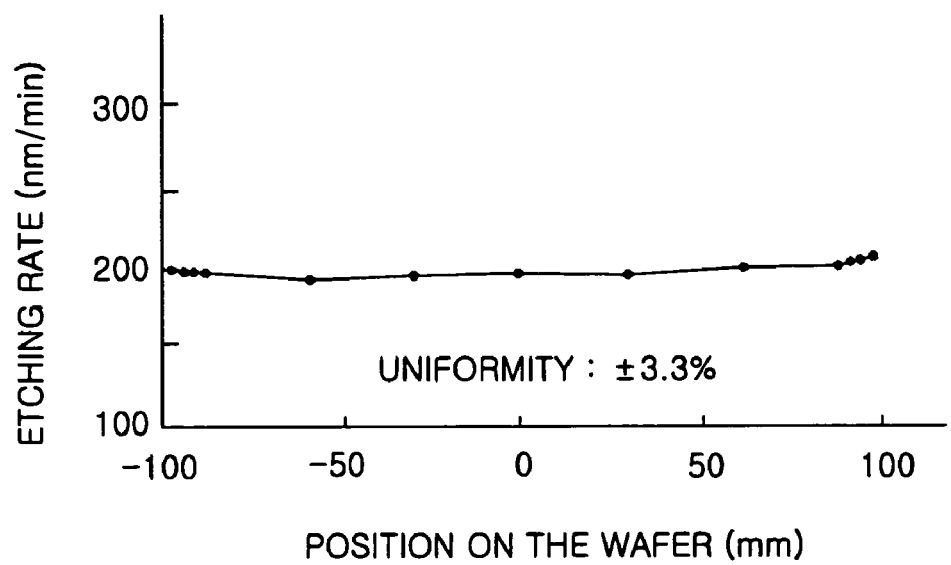

Results of the first experiment in accordance with the first preferred embodiment are shown in FIGS. 8A to 8B, while those of the first comparative experiment are shown in FIGS. 9A to 9B. Each of FIGS. 8A and 9A shows data for the lens material layer 31, and each of FIGS. 8B and 9B shows data for the mask layer 32. In these drawings, the vertical axis represents the etching rate, and the horizontal axis represents the location on the wafer.

From the results, it can be seen that in case the $SF_6$ gas and the $CHF_3$ gas are used as the etching gas, both the lens material layer 31 and the mask layer 32 show etching rates of about 300 nm/min, which are higher than those obtained by employing the $CF_4$ gas. Further, in case the $SF_6$ gas and the $CHF_3$ gas are used as the etching gas, both the lens material layer 31 and the mask layer 32 can be processed with a high in-surface uniformity unlike the case of employing the $CF_4$ gas.

In a second experiment in accordance with the first preferred embodiment, $SF_6$ gas and $CHF_3$ gas as the etching gas, a P—SiN film as the lens material layer 31, and a KrF resist film as the mask layer 32 were employed to form micro lenses 3. While the flow rate of the $SF_6$ gas was set to 50 sccm, and the flow rate of the $CHF_3$ gas was varied from 0 sccm to 40 sccm, the relationship between the amount of the $CHF_3$ gas and the etching rates of the lens material layer 31 and the mask layer 32 was checked. As for the etching conditions, the temperature of the mounting table 41 was 40° C., the pressure was 10.64 Pa, the high frequency power was 800 W, and the magnetic field was 120 G.

Figure 10A:
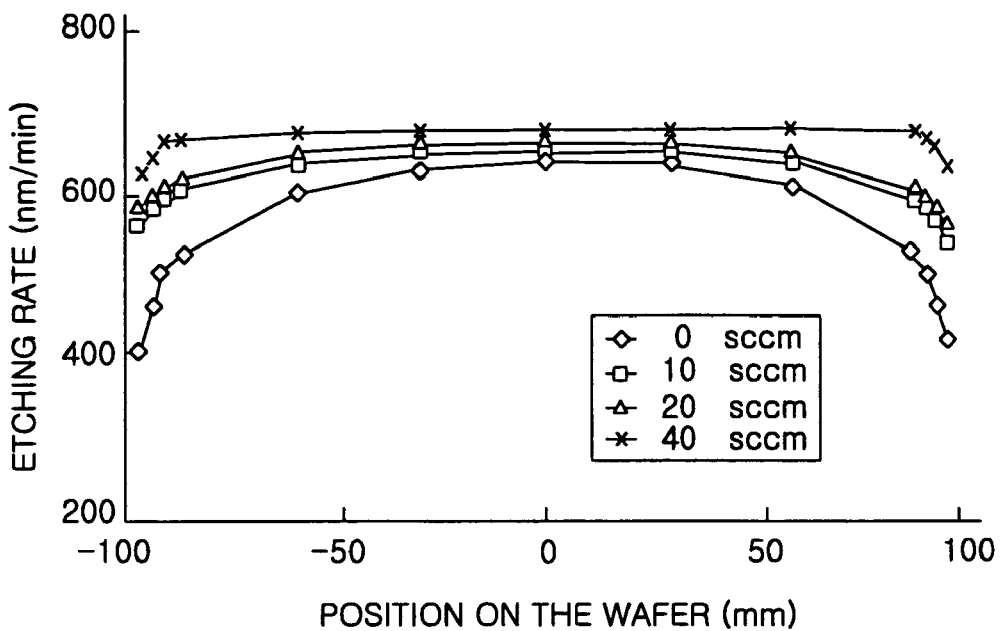
FIGS. 10A and 10B provide etching rate characteristic diagrams showing a result of a second experiment in accordance with the first preferred embodiment of the present invention.
Figure 10B:
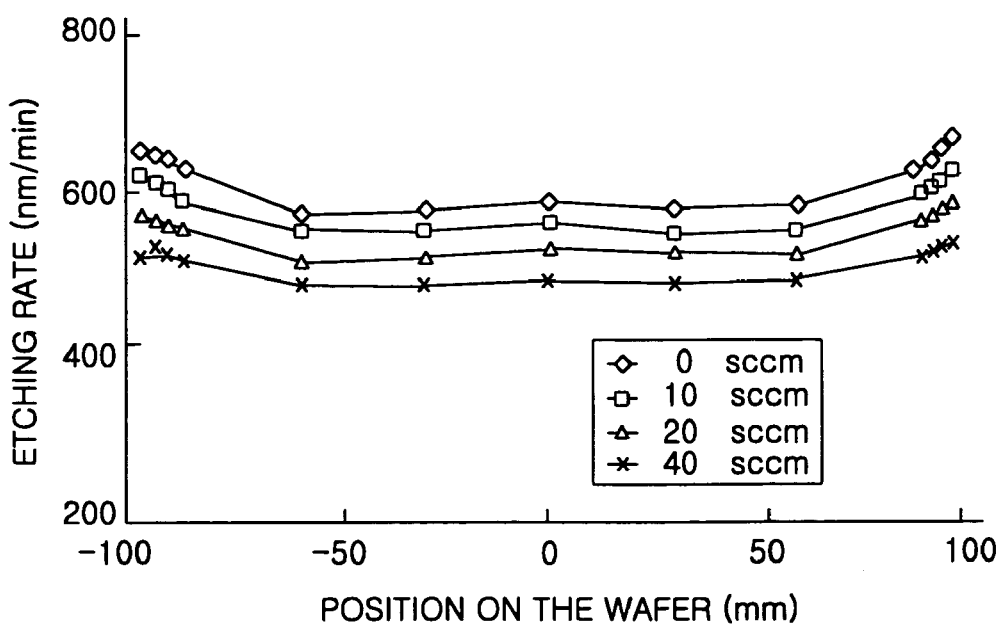

Results of the experiment are shown in FIGS. 10A and 10B. FIG. 10A shows data for the lens material layer 31, and FIG. 10B shows data for the mask layer 32. In the drawings, the vertical axis represents the etching rate, and the horizontal axis represents the location on the wafer. As shown in FIGS. 10A and 10B, it is found that both in-surface uniformities for the lens material layer 31 and the mask layer 32 are improved by adding the $CHF_3$ gas, and that the in-surface uniformities get better as the amount of the $CHF_3$ gas increases from 0 sccm to 40 sccm. Further, while the etching rate for the mask layer 32 decreases as the amount of the $CHF_3$ gas increases, the etching rate for the lens material layer 31 increases as the amount of the $CHF_3$ gas increases. Therefore, it is demonstrated that it is possible to control the selectivity by adjusting the amount of the $CHF_3$ gas.

In a third experiment in accordance with the first preferred embodiment, the $SF_6$ gas and the $CHF_3$ gas as the etching gas, a P—SiN film as the lens material layer 31, and a KrF resist film as the mask layer 32 were employed to form micro lenses 3. Further, the relationship between the amount of the $CHF_3$ gas and the etching rates of the lens material layer 31 and the mask layer 32 was investigated. As for the etching conditions, the temperature of the mounting table 41 was 40° C., the pressure was 2.66 Pa, the high frequency power was 400 W, the magnetic field was 120 G, and the flow rate of the $SF_6$ gas was 60 sccm. The etching rate was measured when the flow rate of the $CHF_3$ gas was changed to 60 sccm, 75 sccm and 100 sccm, respectively.

Figure 11A:
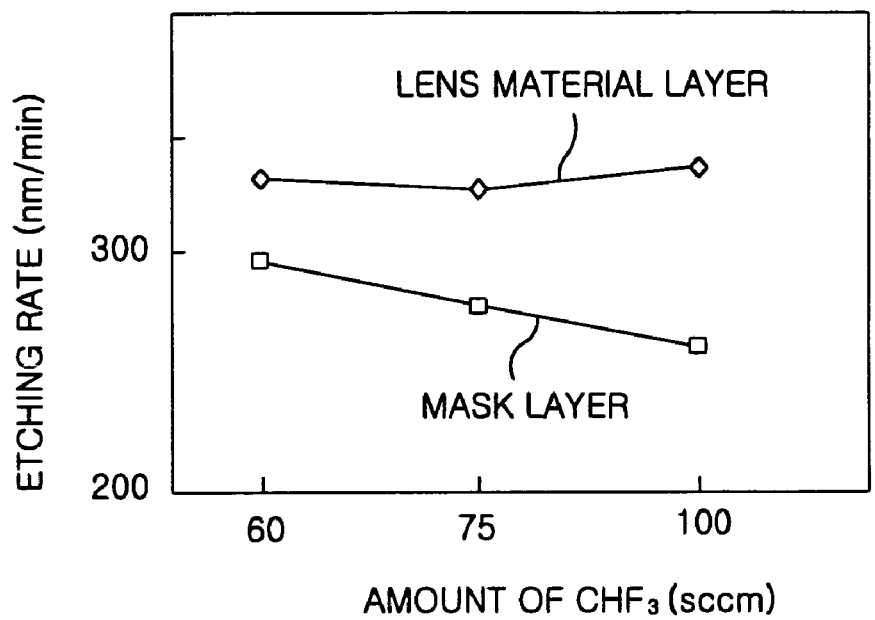
FIGS. 11A and 11B show characteristic diagrams showing a relation between an etching rate and a ratio of gas flow rates, which is a result of a third experiment in accordance with the first preferred embodiment of the present invention.

Results of the experiment are shown in FIG. 11A. In the drawing, the vertical axis represents the etching rate, and the horizontal axis represents the amount of the $CHF_3$ gas. As shown in FIG. 11A, it is found that the etching rate of the lens material layer 31 is substantially constant regardless of the amount of the $CHF_3$ gas employed, while the etching rate of the mask layer 32 decreases as the amount of the $CHF_3$ gas increases.

Figure 11B:
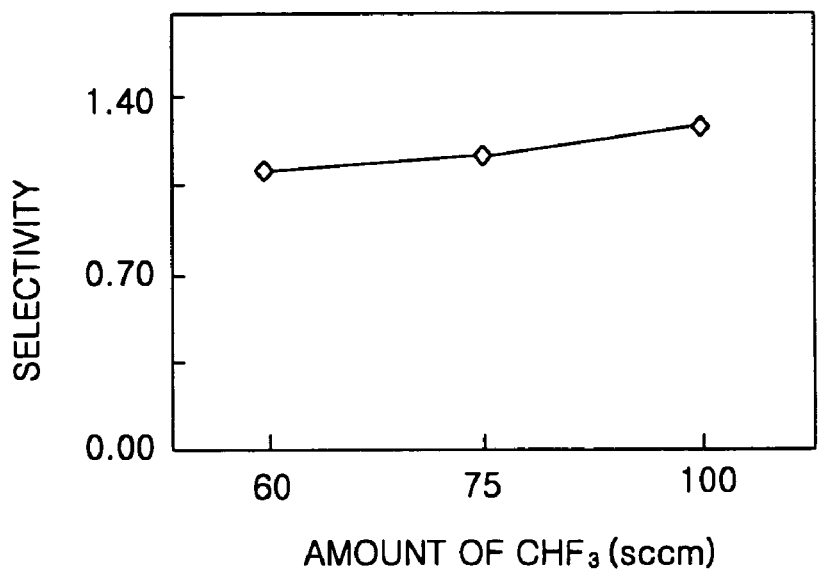

FIG. 11B shows the relationship between the amount of the $CHF_3$ gas and the selectivity based on the result in FIG. 11A. Here, the selectivity is calculated by dividing the etching rate of the lens material layer 31 by that of the mask layer 32. In the figure, the vertical axis represents the selectivity, and the horizontal axis represents the amount of the $CHF_3$ gas. As a result, it is found that the selectivity changes as the amount of the $CHF_3$ gas changes. Therefore, it is possible to control the selectivity by controlling the amount of the $CHF_3$ gas.

In a fourth experiment in accordance with the first preferred embodiment, the $SF_6$ gas and the $CHF_3$ gas as the etching gas, a P—SiN film as the lens material layer 31, and a KrF resist film as the mask layer 32 were employed to form micro lenses 3. In this experiment, the relationship between the amount of the $CHF_3$ gas and the lens height and the lens width was evaluated. As for the etching conditions, the temperature of the mounting table 41 was 40° C., the pressure was 2.66 Pa, the high frequency power was 400 W, the magnetic field was 120 G, and the flow rate of the $SF_6$ gas was 60 sccm. After forming the micro lenses 3 with the amount of the $CHF_3$ gas changed between 60 sccm and 75 sccm, the height and the width of the micro lenses 3 were measured.

Figure 12A:
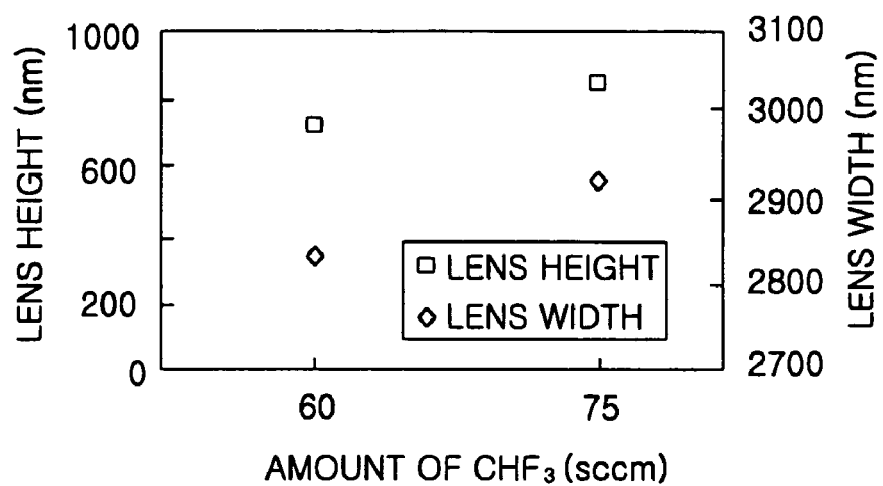
FIG. 12A is a characteristic diagram showing a relation between a lens height and a ratio of gas flow rates, which is a result of a fourth experiment in accordance with the first preferred embodiment of the present invention.

Results of the experiment are shown in FIG. 12A. In the figure, the left vertical axis represents the lens height, the right vertical axis represents the lens width, and the horizontal axis represents the amount of the $CHF_3$ gas. As shown in FIG. 12A, it is found that the height and the width of the micro lenses 3 are changed depending on the amount of the $CHF_3$ gas and, as a result, it is possible to control the lens height and the lens width by controlling the amount of the $CHF_3$ gas.

Figure 12B:
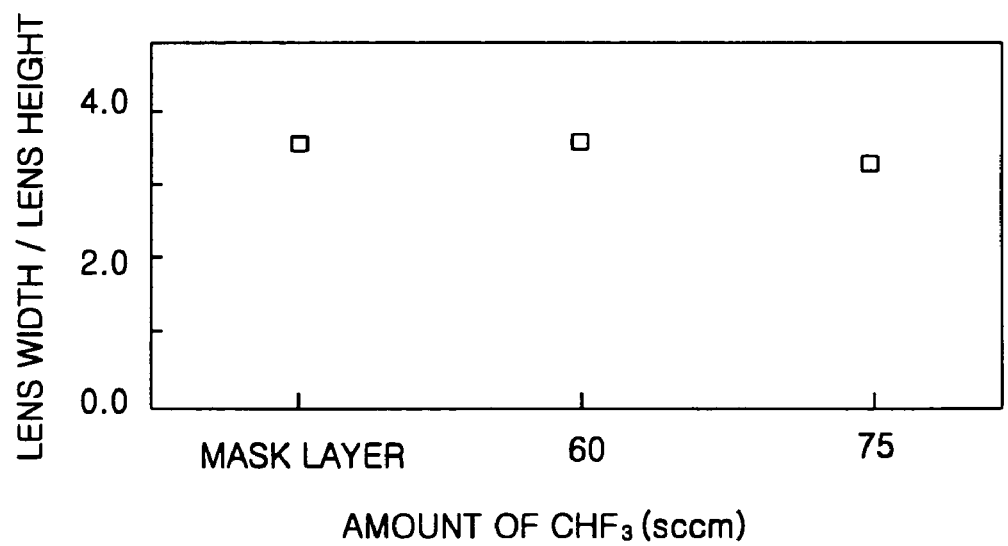
FIG. 12B gives a characteristic diagram showing a relation between a ratio of a lens width to a lens height and a ratio of gas flow rates, which is a result of the fourth experiment in accordance with the first preferred embodiment of the present invention.

Based on the data of FIG. 12A, the data in FIG. 12B was obtained by calculating the ratio of the lens width to the lens height (lens width/lens height) and evaluating the relationship between the ratio and the amount of the $CHF_3$ gas. In the figure, the vertical axis represents the ratio of the lens width to the lens height, and the horizontal axis represents the amount of the $CHF_3$ gas. And, on the left part of FIG. 12B, for the calculated data on the lens shapes of the mask layer 32 is indicated. As a result, it is found that the ratio of the lens width to the lens height changes as the amount of the $CHF_3$ gas changes. Further, it is also verified that when the flow rates of both the $SF_6$ gas and the $CHF_3$ gas are 60 sccm, the micro lenses 3 are formed to have a ratio of the lens width to the lens height most similar to that of the lens shape of the mask layer 32.

In a fifth experiment in accordance with the first preferred embodiment, the $SF_6$ gas and the $CHF_3$ gas as the etching gas, a P—SiN film as the lens material layer 31, and a KrF resist film as the mask layer 32 were employed to form micro lenses 3. In this experiment, the relationship between the pressure and each of the etching rates thereof was checked. As for the etching conditions, the flow rate of the $SF_6$ gas was 60 sccm, the flow rate of the $CHF_3$ gas was 60 sccm, the temperature of the mounting table 41 was 40° C., the high frequency power was 400 W, and the magnetic field was 120 G. With the pressure set at 2.67 Pa, 5.33 Pa, and 13.33 Pa, the etching rates of the lens material layer 31 and the mask layer 32 were measured respectively.

Figure 13A:
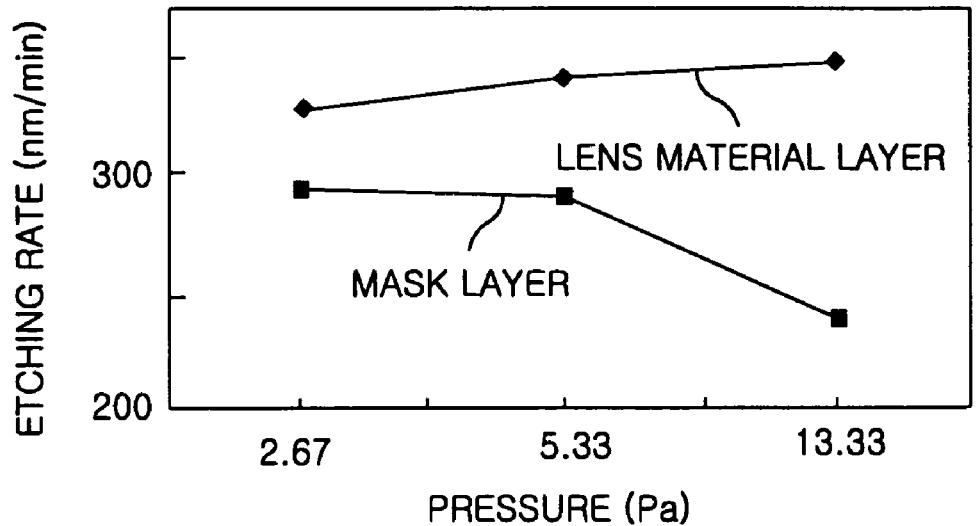
FIG. 13A provides a characteristic diagram showing a relation between an etching rate and pressure, which is a result of a fifth experiment in accordance with the first preferred embodiment of the present invention.

Results of the experiment are shown in FIG. 13A. In the drawing, the vertical axis represents the etching rate, and the horizontal axis represents the pressure. As shown in FIG. 13A, it is found that the etching rate of the lens material layer 31 somewhat increases as the pressure increases, while the etching rate of the mask layer 32 decreases, especially rapidly at a pressure greater than 5.33 Pa, as the pressure decreases. As a result, it is possible to control the etching rate by controlling the pressure.

Figure 13B:
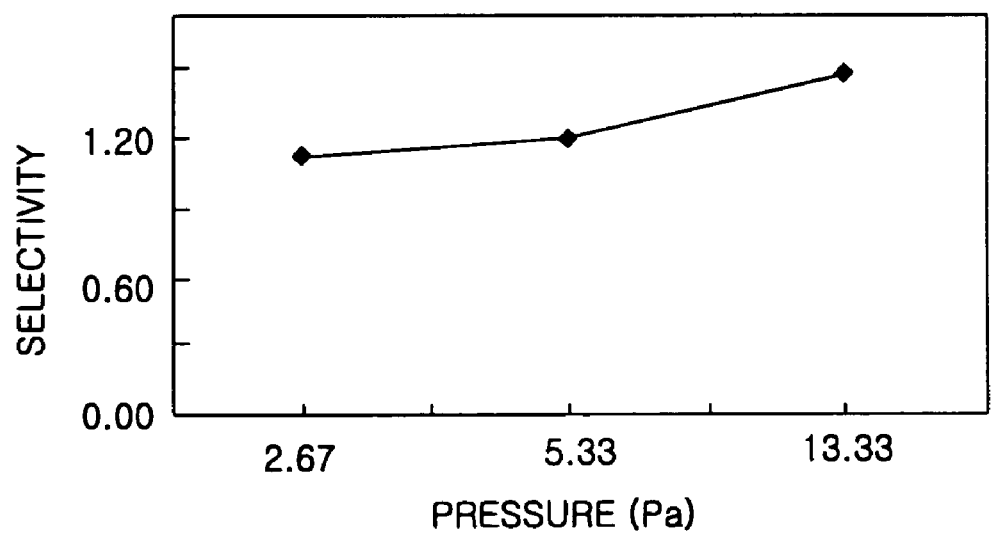
FIG. 13B presents a characteristic diagram showing a relation between a selectivity and pressure, which is a result of the fifth experiment in accordance with the first preferred embodiment of the present invention.

The data shown in FIG. 13B was obtained by calculating the selectivity based on the result in FIG. 13A and the relationship between the selectivity and the pressure. In the figure, the vertical axis represents the selectivity, and the horizontal axis represents the pressure. As a result, it is found that the selectivity increases in proportion to the pressure. Therefore, it is possible to control the lens shape by controlling the pressure.

In a sixth experiment in accordance with the first preferred embodiment, there were employed the $SF_6$ gas and the $CHF_3$ gas as the etching gas, a P—SiN film as the lens material layer 31, and a KrF resist film as the mask layer 32. And, the shapes of several exemplary micro lenses 3, which were respectively formed in the above-described conditions while varying the amount of the $CHF_3$ gas or pressure, are shown in FIGS. 14A to 14D. The lens shapes in the drawings are traces of ×30.0 k magnified photographs for the micro lenses 3 captured by a scanning electron microscope.

Figure 14A:
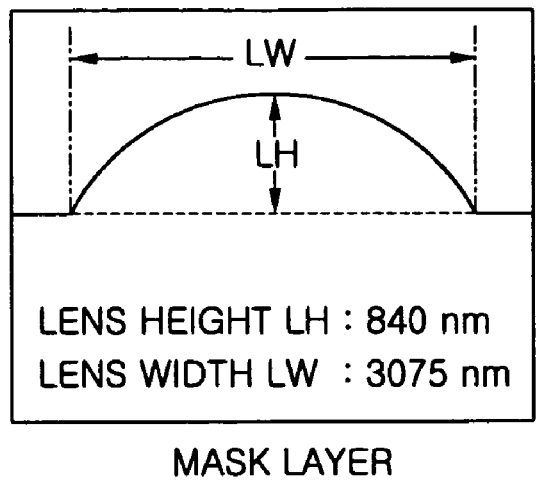
FIGS. 14A to 14D offer cross sectional views showing lens shapes, which are results of a sixth experiment in accordance with the first preferred embodiment of the present invention.

In particular, FIG. 14A shows the lens shape of the mask layer 32, having a height of 840 nm and a width of 3075 nm.

Figure 14B:
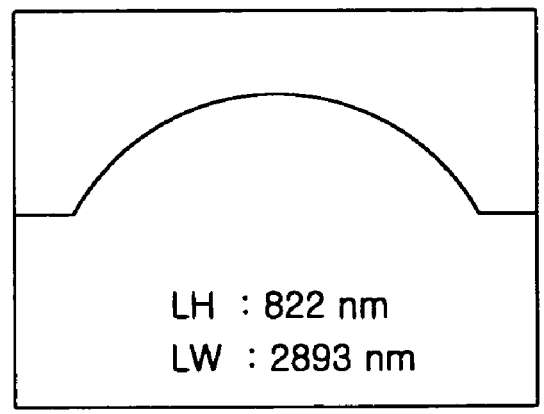

Further, FIG. 14B illustrates the shape of a micro lens 3, having a height of 822 nm and a width of 2893 nm, formed in a condition wherein the flow rate of the $SF_6$ gas was 60 sccm, the flow rate of the $CHF_3$ gas was 60 sccm, and the pressure was 2.67 Pa.

Figure 14C:
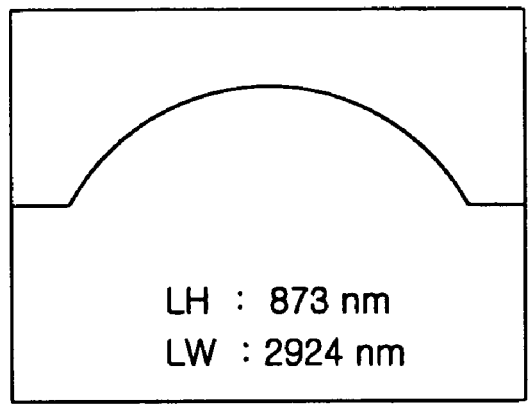

FIG. 14C charts the shape of a micro lens 3, having a height of 873 nm and a width of 2924 nm, formed in a condition wherein the flow rate of the $SF_6$ gas was 60 sccm, the flow rate of the $CHF_3$ gas was 75 sccm, and the pressure was 2.67 Pa.

Figure 14D:
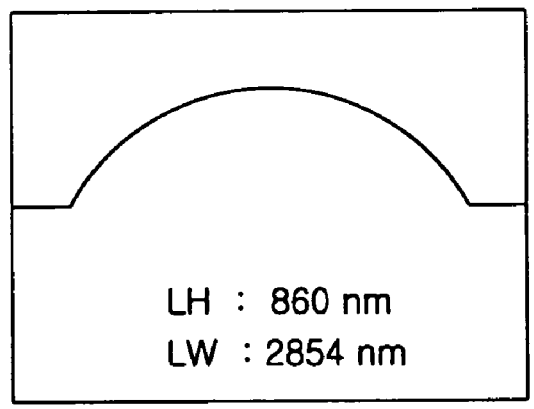

Finally, FIG. 14D exhibits the shape of a micro lens 3, having a height of 860 nm and a width of 2854 nm, formed in a condition wherein the flow rate of the $SF_6$ gas was 60 sccm, the flow rate of the $CHF_3$ gas was 60 sccm, and the pressure was 5.33 Pa.

According to the results shown in FIGS. 14A to 14D, it is found that the lens height and the lens width can be controlled by changing the amount of the $CHF_3$ gas or the pressure. Although the experiment was performed by varying the amount of the $CHF_3$ while the flow rate of the $SF_6$ gas is fixed at 60 sccm, it is also possible to control the lens shape by changing the ratio of the flow rates of the $SF_6$ gas and the $CHF_3$ gas while the total flow rate thereof is fixed. Further, similar results could be obtained in an experiment with a same condition as the above except that a LP—SiN film as the lens material layer 31 and a KrF resist film or an i-line resist film as the mask layer 32 are employed. Also, an experiment with a same condition as the above except employing CO gas instead of the $CHF_3$ gas, i.e., employing a combination of the $SF_6$ gas and the CO gas as the etching gas, gave a same effect as described above. Therefore, it is found that a combination of the $SF_6$ gas and the CO gas is also effective.

Hereinafter, experiments in accordance with the second preferred embodiment will be described in detail.

Figure 15A:
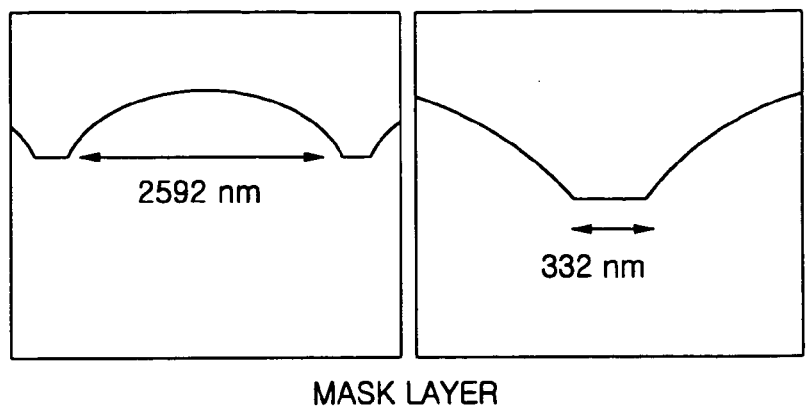
FIGS. 15A to 15C present cross sectional views showing lens shapes and distances between adjacent lenses, which are results of a first experiment in accordance with the second preferred embodiment of the present invention.
Figure 15B:
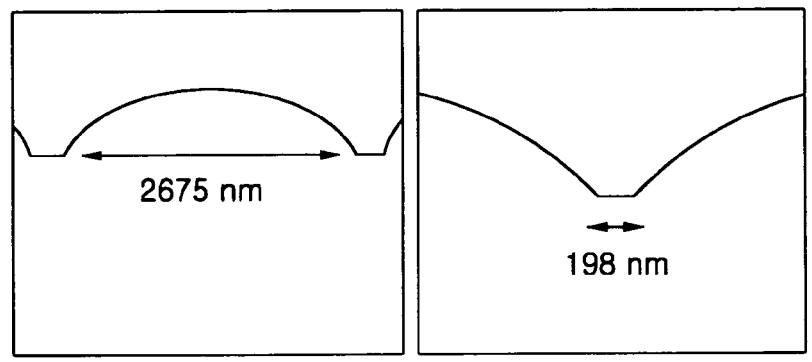
Figure 15C:
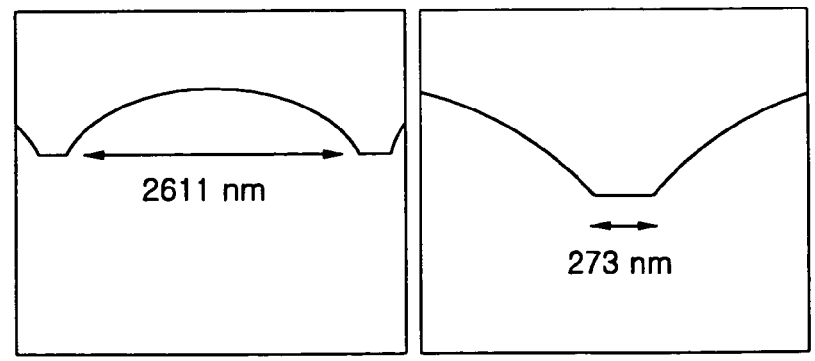
Figure 16A:
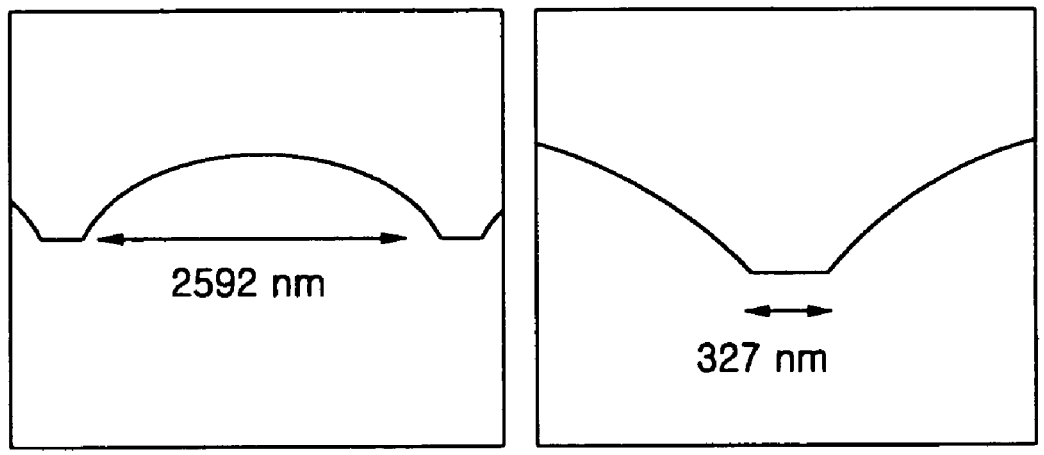
FIGS. 16A and 16B provide cross sectional views showing lens shapes and distances between adjacent lenses, which are results of a second comparative experiment.

First, in a first experiment in accordance with the second preferred embodiment, micro lenses 3 were formed by employing the CxFy gas and the CO gas as the etching gas, a resin based organic film made of an i-line phenolic system as the lens material layer 31, and a resist film made of an i-line phenolic system as the mask layer 32, and by varying the ratio of gas flow rates. FIGS. 15A to 15C shows the shapes of several exemplary micro lenses 3. As a second comparative experiment, lens shapes formed in case of using only $CF_4$ gas is shown in FIG. 16A; and, those formed in case of using a mixture of $CF_4$ gas and $O_2$ gas, FIG. 16B. The lens shapes in the drawings are traces of lens shapes of the micro lenses 3 and areas therebetween in ×30.0 k magnified photographs captured by a scanning electron microscope.

Particularly, FIG. 15A shows the lens shape of the mask layer 32, having a width of 2592 nm and a distance between adjacent lenses of 332 nm.

FIG. 15B provides the shape of a micro lens 3, having a width of 2675 nm and a distance between adjacent lenses of 198 nm, formed in a condition wherein the flow rate of the $CF_4$ gas was 60 sccm, and the flow rate of the CO gas was 60 sccm.

Further, FIG. 15C exhibits the shape of a micro lens 3, having a width of 2611 nm and a distance between adjacent lenses of 273 nm, formed in a condition wherein the flow rate of the $CF_4$ gas was 30 sccm, and the flow rate of the CO gas was 90 sccm.

FIG. 16A charts the shape of a micro lens 3, having a width of 2592 nm and a distance between adjacent lenses of 327 nm, formed using the $CF_4$ gas whose flow rate was 60 sccm.

Figure 16B:
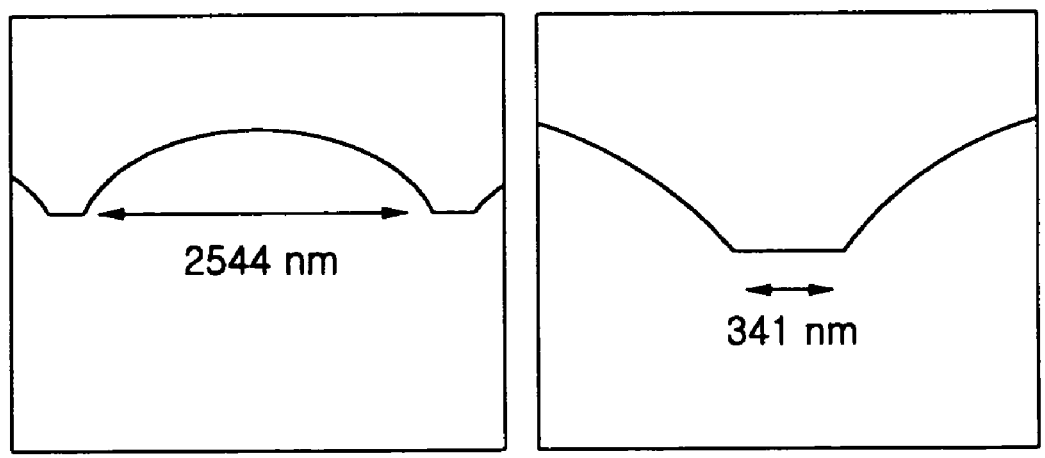

FIG. 16B shows the shape of a micro lens 3, having a width of 2544 nm and a distance between adjacent lenses of 341 nm, formed in a condition wherein the flow rate of the $CF_4$ gas was 30 sccm, and the flow rate of the $O_2$ gas was 8 sccm.

As shown in the drawings, it is found that by using a combination of the CxFy gas and the CO gas, it is possible to form micro lenses 3 having a larger width and a smaller distance therebetween than those in case of using the $CF_4$ gas only or in case of using a combination of the $CF_4$ gas and the $O_2$ gas. Further, it is possible to control the lens width and the distance between adjacent lenses by changing the ratio of the flow rates of the CxFy gas and the CO gas, and to set the lens diameter larger than that of, and set the distance between adjacent lenses smaller than that of the lens shapes of the mask layer 32, by using a combination of the CxFy gas and the CO gas.

Further, based on results of the experiment wherein micro lenses 3 were formed by varying the ratio of the flow rates of the $CF_4$ gas and the CO gas, it is found that it is preferable to set the ratio of the flow rates of the $CF_4$ gas and the CO gas to be 10:1 to 1:10 in order to form micro lenses 3 having a curvature substantially same with, a lens width larger than, and a distance between lenses smaller than those of the lens shapes of the mask layer 32. In the process using the combination of the $CF_4$ gas and the $O_2$ gas as shown in FIG. 16B, the ratio of the flow rates was set to be such a value that an in-surface uniformity is maximized and a distance between adjacent lenses is minimized.

Figure 17:
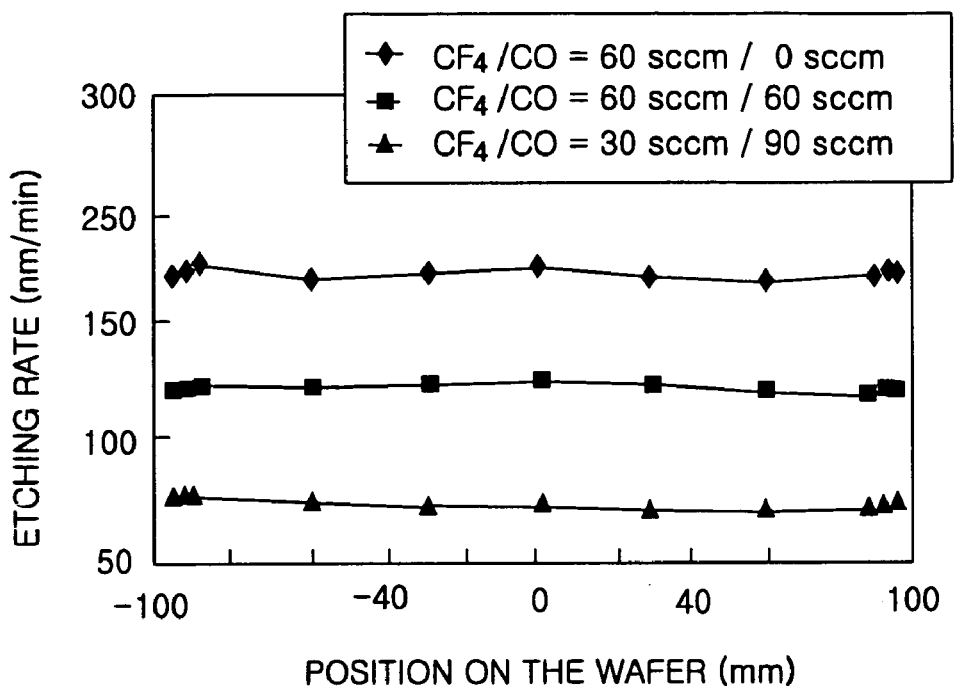
FIG. 17 shows an etching rate characteristic diagram showing a result of a second experiment in accordance with the second preferred embodiment of the present invention.

In a second experiment in accordance with the second preferred embodiment, there were employed the CxFy gas and the CO gas as the etching gas, a resin based organic film made of an i-line phenolic system as the lens material layer 31, and a resist film made of an i-line phenolic system as the mask layer 32. In such a condition, an in-surface uniformity of an etching rate was measured while varying the ratio of gas flow rates. Here, $CF_4$ gas was employed for the CxFy gas, and the etching rate was measured while changing the ratio of the flow rates of the $CF_4$ gas and the CO gas. The result is shown in FIG. 17, wherein the vertical axis represents the etching rate, and the horizontal axis represents the location on the wafer. In the drawing, ♦ denotes data in case the flow rates of the $CF_4$ gas and the CO gas are 60 sccm and 0 sccm, respectively; ■ denotes data in case the flow rates of the $CF_4$ gas and the CO gas are both 60 sccm; and ▲ denotes data in case the flow rates of the $CF_4$ gas and the Co gas are 30 sccm and 90 sccm, respectively. At this time, as for the etching conditions, the temperature of the mounting table 41 was 40° C., the pressure was 2.66 Pa, the high frequency power was 600 W, and the magnetic field was 120 G.

As shown in FIG. 17, it is found that the in-surface uniformity is satisfactory in any of the above cases above while the etching rate changes as the ratio of gas flow rates changes.

Meanwhile, in an experiment performed in the conditions same as the above experiment except employing an i-line phenolic system film as the lens material layer 31 and a KrF resist film as the mask layer 32, a same effect as described above could be obtained. Further, in an experiment performed in the conditions same as the above experiment except employing a $C_2F_6$ gas or a $C_3F_8$ gas instead of the $CF_4$ gas, a same effect as described above could be obtained. In this case, it is possible to form micro lenses having a larger lens diameter, due to a larger amount of a deposition class sued in the experiment, than in a case of employing the $CF_4$ gas.

Subsequently, experiments in accordance with the third preferred embodiment will be described in detail.

First, in a first experiment in accordance with the third preferred embodiment, the relationship between the kind of gas and the etching rate thereof was measured in case there were employed a gas including carbon and fluorine therein as the etching gas, a resin based organic film made of an i-line phenolic system as the lens material layer 31, and a resist film made of an i-line phenolic system as the mask layer 32. As for the etching conditions, the temperature of the mounting table 41 was 40° C., the pressure was 2.66 Pa, the high frequency power was 600 W, the magnetic field was 120 G. Further, the etching gas was selected from the group consisting of $CF_4$ gas, $C_2F_6$ gas and $C_3F_8$ gas, and the flow rates thereof were 60 sccm, respectively.

Figure 18:
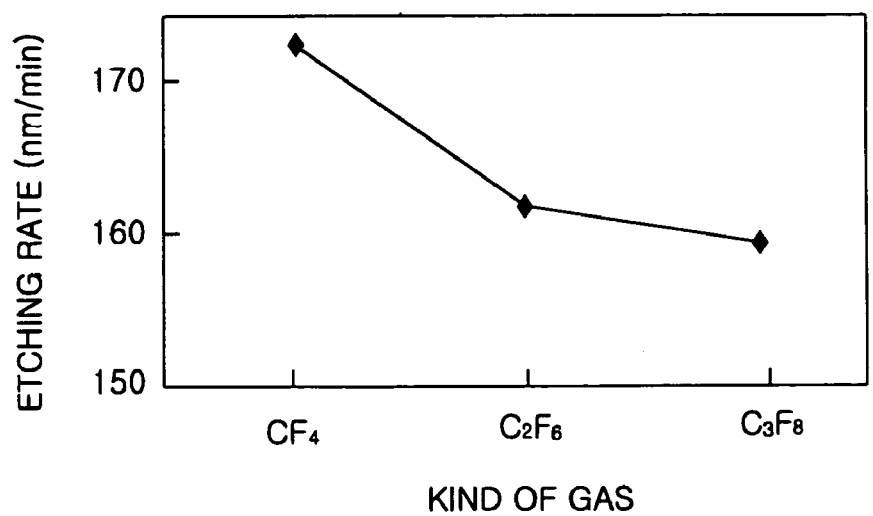
FIG. 18 gives a characteristic diagram showing a relation between an etching rate and a kind of gas, which is a result of a first experiment in accordance with the third preferred embodiment of the present invention.

The result of the experiment is shown in FIG. 18, wherein the vertical axis represents the etching rate, and the horizontal axis represents the kind of gas. As shown in FIG. 18, it is clear that the etching rate differs depending on the kind of gas, and the etching rate is in inverse proportion to carbon number.

Figure 19A:
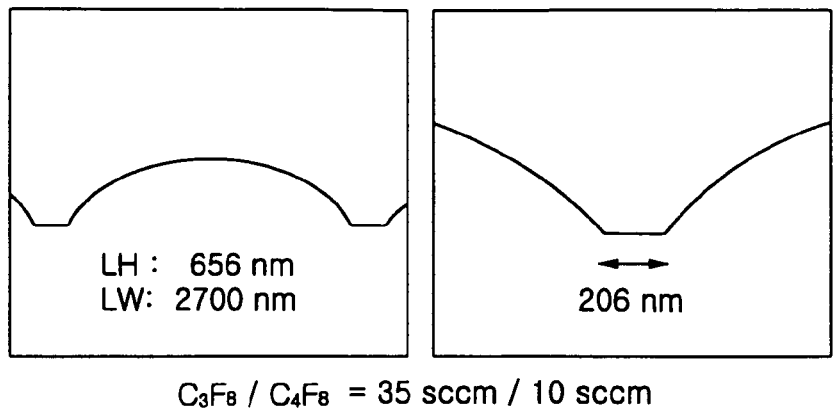
FIGS. 19A to 19C present cross sectional views showing lens shapes and distances between lenses, which are results of a second experiment in accordance with the third preferred embodiment of the present invention.
Figure 19B:
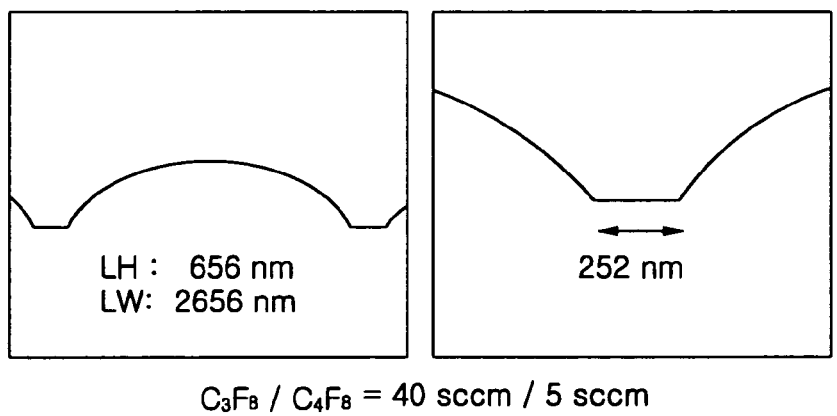

In a second experiment in accordance with the third preferred embodiment, there were employed $Cx_1Fy_1$ gas and $Cx_2Fy_2$ gas as the etching gas, a resin based organic film made of an i-line phenolic system as the lens material layer 31, and a resist film made of an i-line phenolic system as the mask layer 32. In such a condition, several exemplary micro lenses were formed while varying the ratio of gas flow rates, the shapes of which are shown in FIGS. 19A and 19B. As for the etching conditions, the temperature of the mounting table 41 was 40° C., the pressure was 2.66 Pa, the high frequency power was 600 W, and the magnetic field was 120 G. The lens shapes in the drawings are traces of lens shapes of the micro lenses 3 and areas therebetween in ×30.0 k magnified photographs captured by a scanning electron microscope.

First, FIG. 19A shows the shapes of micro lenses 3, having a height of 656 nm, a width of 2700 nm, and a distance between adjacent lenses of 206 nm, formed in a condition wherein the flow rates of the $C_3F_8$ gas and the $C_4F_8$ gas were 35 sccm and 10 sccm, respectively.

FIG. 19B shows the shapes of micro lenses 3, having a height of 656 nm, a width of 2656 nm, and a distance between adjacent lenses of 252 nm, formed in a condition wherein the flow rates of the $C_3F_8$ gas and the $C_4F_8$ gas were 40 sccm and 5 sccm, respectively.

Figure 19C:
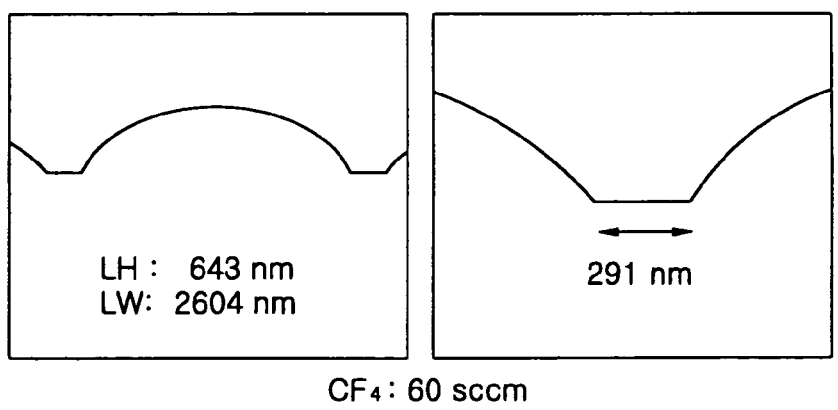

Finally, FIG. 19C shows a result of a third comparative experiment, wherein the shapes of micro lenses 3 were formed to have a height of 643 nm, a width of 2604 nm, and a distance between adjacent lenses of 291 nm, by using only $CF_4$ gas with a flow rate of 60 sccm.

As shown in the drawings, it is found that it is possible to form micro lenses 3 having a curvature substantially same with, a width larger than, and a distance between lenses smaller than those of the lens shapes of the mask layer 32, by using a combination of the $C_3F_8$ gas and the $C_4F_8$ gas, in comparison with a case where a $CF_4$ gas is solely used. Therefore, it is demonstrated that the process of this preferred embodiment is effective. Further, it is possible to control the shape of the obtained micro lenses 3, such as the height and the width thereof, by changing the ratio of the flow rates of the $C_3F_8$ gas and the $C_4F_8$ gas. Furthermore, the result of forming micro lenses 3 with respect to several ratios of the flow rates of the $C_3F_8$ gas and the $C_4F_8$ gas shows that it is preferable to set the ratio of the flow rates of the $C_3F_8$ gas and the $C_4F_8$ gas to be 10:1 to 1:1, in order to form micro lenses 3 having a curvature substantially same with, a width larger than, and a distance between lenses smaller than those of the lens shape of the mask layer 32.

In a third experiment in accordance with the third preferred embodiment, a variation of an etching rate was investigated while varying a kind of gas or the ratio of gas flow rates, wherein there were employed the $Cx_1Fy_1$ gas and the $Cx_2Fy_2$ gas as the etching gas, a resin based organic film made of an i-line phenolic system as the lens material layer 31, and a resist film made of an i-line phenolic system as the mask layer 32. As for the etching conditions, the temperature of the mounting table 41 was 40° C., the pressure was 2.66 Pa, the high frequency power was 600 W, and the magnetic field was 120 G.

Figure 20A:
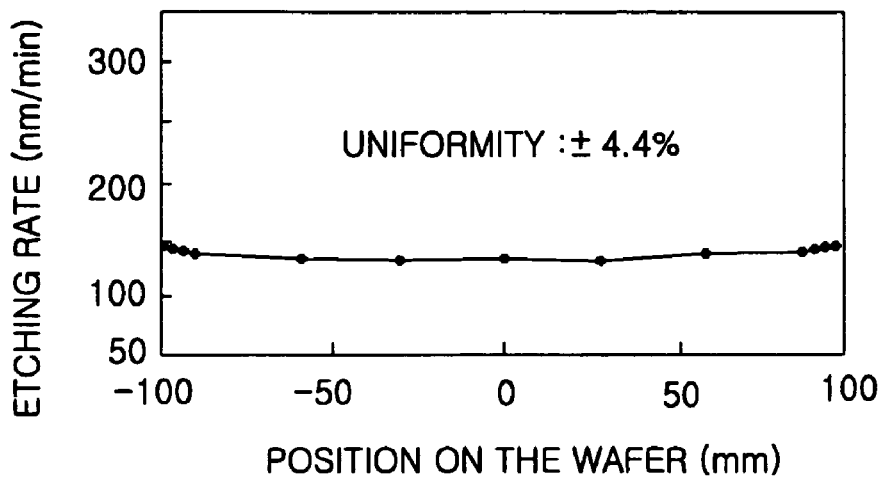
FIGS. 20A and 20B are etching rate characteristic diagrams showing results of a third experiment in accordance with the third preferred embodiment of the present invention.
Figure 20B:
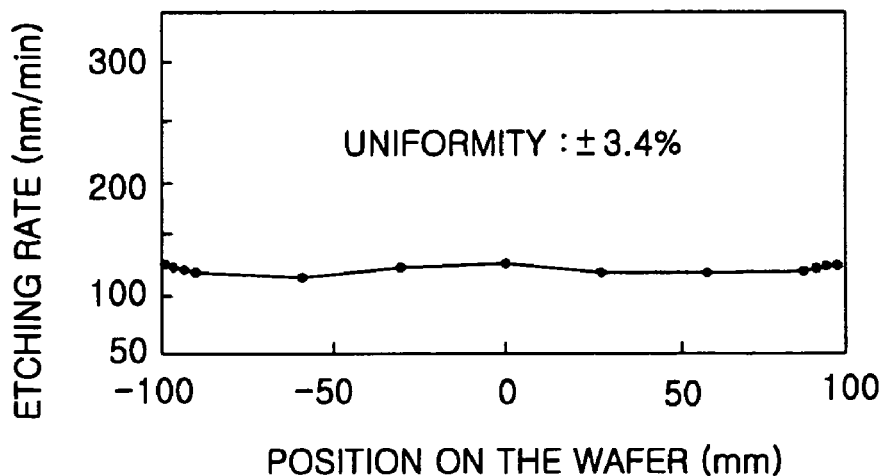
Figure 21A:
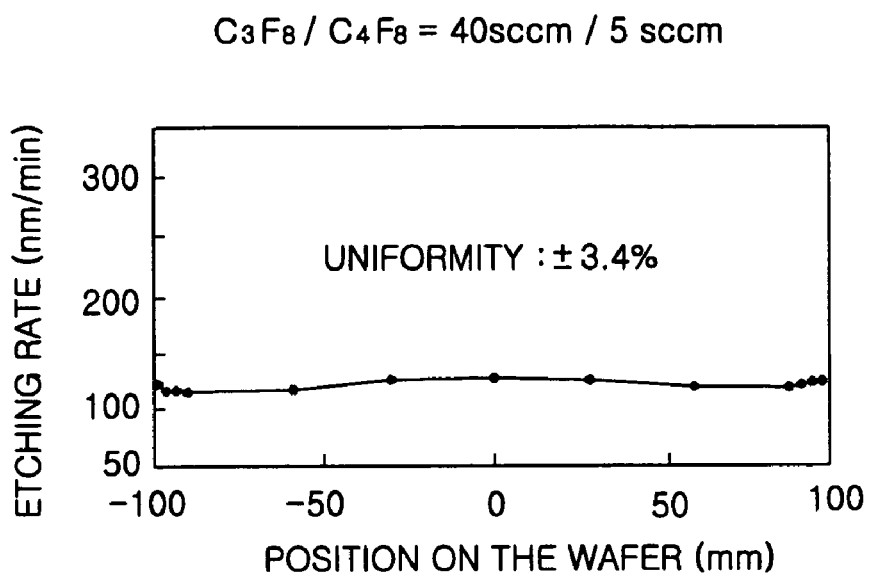
FIGS. 21A and 21B provide etching rate characteristic diagrams showing results of the third experiment in accordance with the third preferred embodiment of the present invention.
Figure 21B:
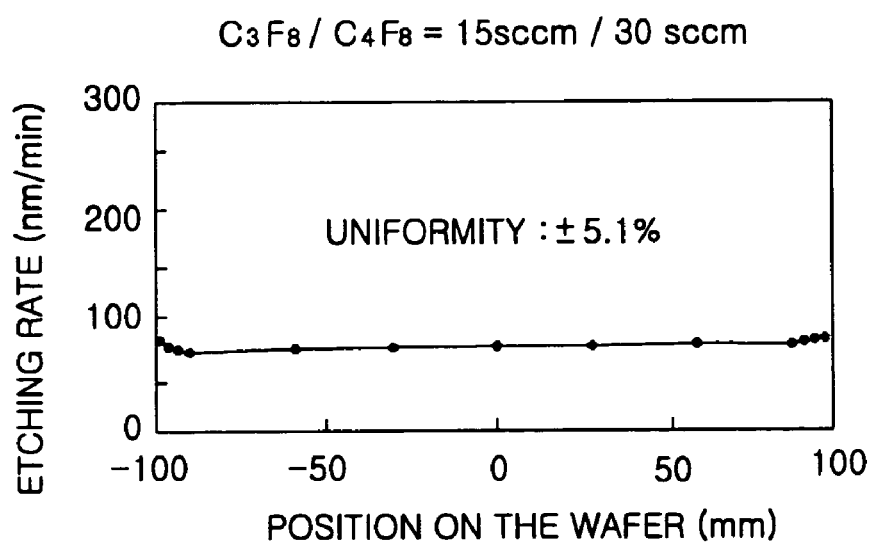

Results of the experiment are shown in FIGS. 20A, 20B, 21A and 21B. FIG. 20A shows an etching result in the conditions wherein the flow rate of $C_2F_6$ gas is 40 sccm and the flow rate of $C_4F_8$ gas is 5 sccm; FIG. 20B, in the conditions wherein $C_3F_8$ gas is 30 sccm and $C_4F_8$ gas is 10 sccm; FIG. 21A, in the conditions wherein $C_3F_8$ gas is 40 sccm and $C_4F_8$ gas is 5 sccm; and FIG. 21B, in the conditions wherein $C_3F_8$ gas is 15 sccm and $C_4F_8$ gas is 30 sccm. In the drawings, the vertical axis represents the etching rate, and the horizontal axis represents the location on the wafer. From the results, it can be seen that an in-surface uniformity is satisfactory for any combination of the $Cx_1Fy_1$ gas and the $Cx_2Fy_2$ gas.

Figure 23:
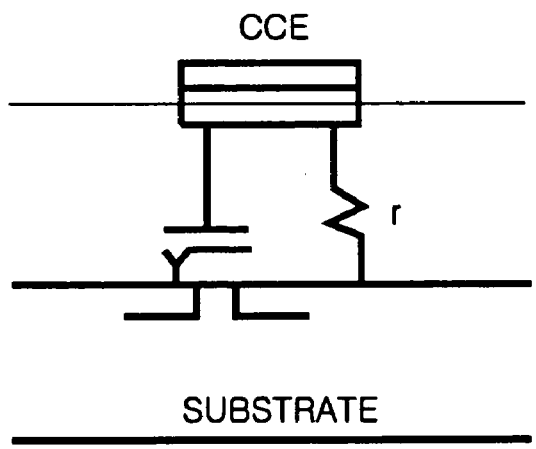
FIG. 23 illustrates an UV sensor employed in the fourth experiment in accordance with the third preferred embodiment of the present invention.
Figure 24:
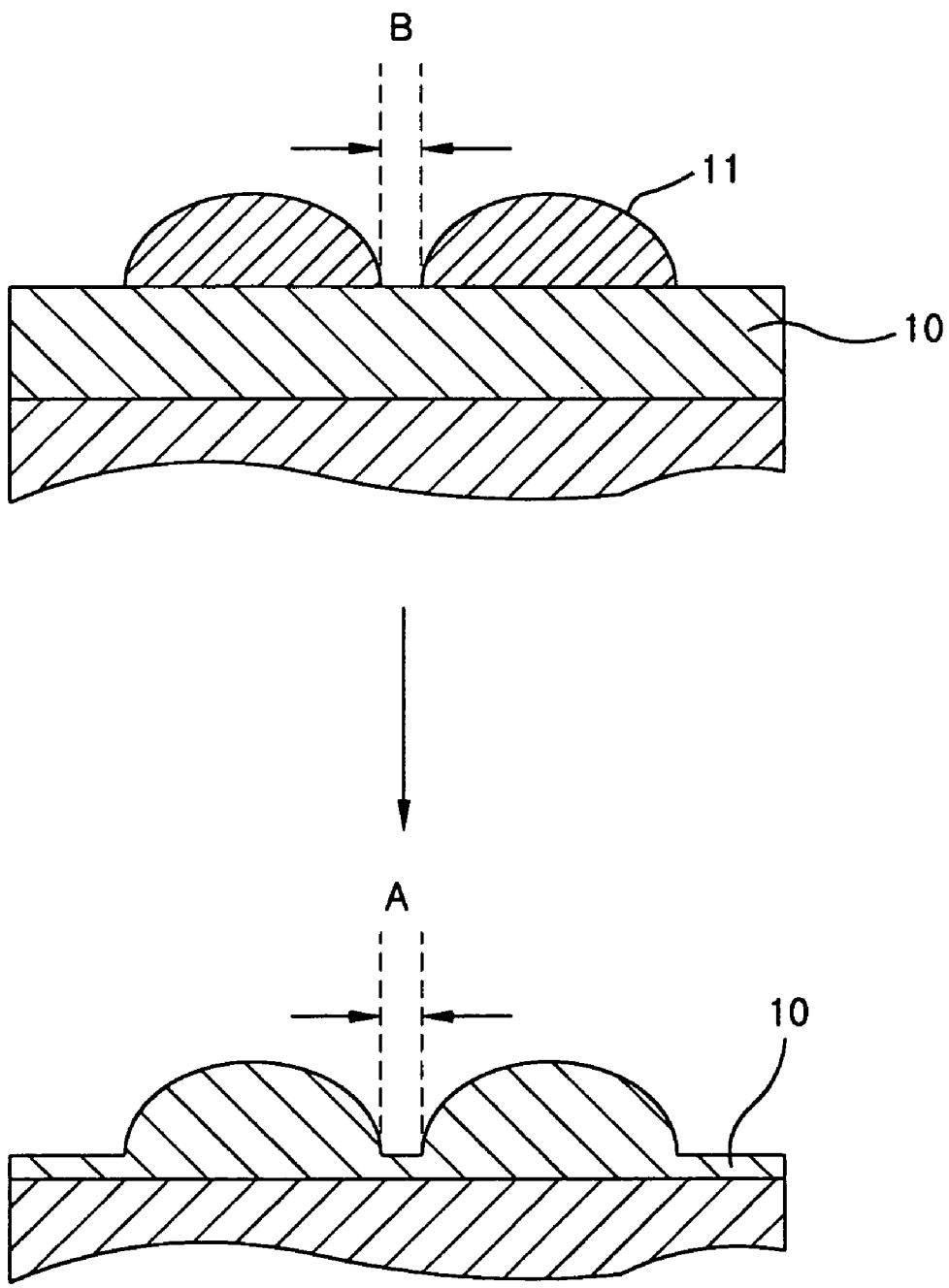
FIG. 24 provides cross sectional views showing a conventional method for forming micro lenses.

In a fourth experiment in accordance with the third preferred embodiment, a wafer with an UV sensor attached thereto, which is shown in FIG. 23, was etched for 10 seconds using CxFy gas in the plasma etching apparatus described above, and the amount of UV generated during the etching was measured by the UV sensor. Here, $CF_4$ gas, $C_2F_6$ gas, $C_3F_8$ gas and $C_4F_8$ gas were respectively used as the CxFy gas. As for the etching conditions, the temperature of the mounting table 41 was 40° C., the pressure was 5.32 Pa, the high frequency power was 600 W, and the magnetic field was 120 G.

Figure 22:
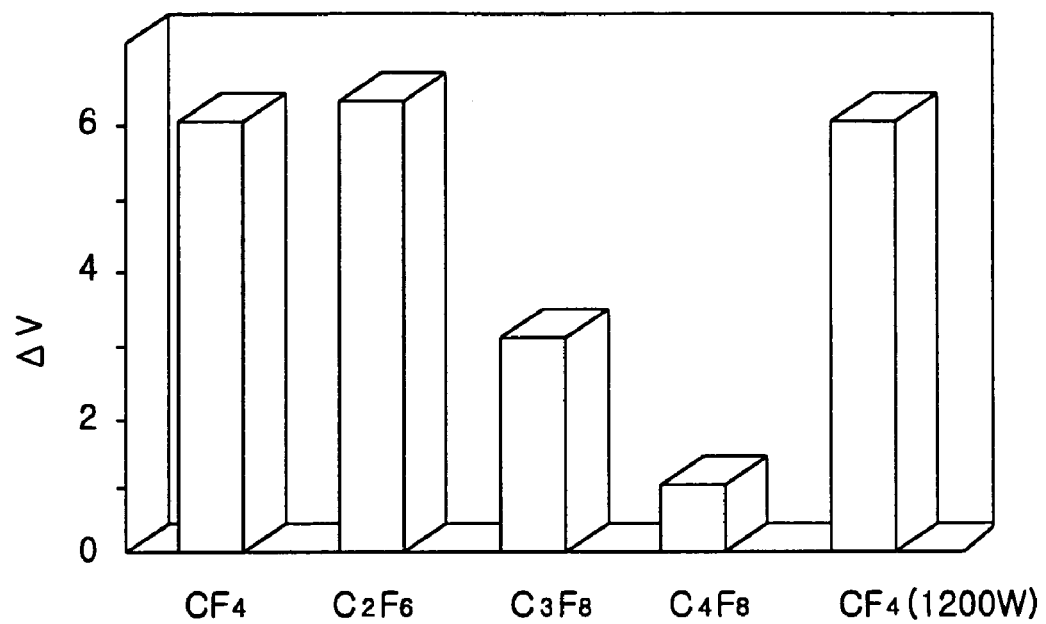
FIG. 22 is a characteristic diagram showing a relation between an amount of ultraviolet (UV) and a kind of gas, which is a result of a fourth experiment in accordance with the third preferred embodiment of the present invention.

Results of the experiment are shown in FIG. 22, wherein the vertical axis represents ΔV (a UV value V) of the UV sensor, and the horizontal axis represents the kind of gas. Here, a higher value in the vertical axis means that a reaction of the UV sensor is strong and the amount of UV generated is large. The UV sensor, employed in the above experiment, measures the amount of UV by virtue of a feature that Vt of EEPROM changes in proportion to an irradiation of UV as shown in FIG. 23. In accordance with the result of FIG. 22, the amount of UV generated differs depending on the kind of gas, and the amount of UV generated is low in case of using $C_3F_8$ and in case of $C_4F_8$. Consequently, it is presumed that, by combining $Cx_1Fy_1$ gas and $Cx_2Fy_2$ gas, the amount of UV generated can be reduced, and, therefore, a corruption of an image caused by the generation of UV can be suppressed.

Meanwhile, in an experiment performed in a same condition as the above experiment except employing an i-line phenolic system film as the lens material layer 31 and a KrF resist film as the mask layer 32, a same effect as described above could be obtained. Further, in an experiment performed in a same condition as the above experiment except employing several combinations of the $Cx_1Fy_1$ gas and the $Cx_2Fy_2$ gas, wherein the $Cx_1Fy_1$ gas is chosen from the group consisting of $CF_4$ gas, $C_2F_6$ gas and $C_3F_8$ gas, and the $Cx_2Fy_2$ gas is chosen from the group consisting of $C_4F_6$ gas, $C_4F_8$ gas and $C_5F_8$ gas, a same effect as described above could be also obtained, which means that a combination of the $Cx_1Fy_1$ gas and the $Cx_2Fy_2$ gas is effective.

The above-described processes performed in the plasma etching apparatus may be executed by introducing thereto a rare gas, such as He gas, Ar gas, Ne gas, Kr gas and Xe gas. Further, the etching treatment in accordance with the present invention may be performed not only in the above plasma etching apparatus but also in an apparatus that generates a plasma by employing another method such as a microwave plasma generation method and an ECR method. Further, the method in accordance with the present invention is effective in forming not only micro lenses on a most superficial surface of a layer but also lenses in the layer. Further, as an object to be processed where the micro lenses are formed, for example, a glass substrate for a flat panel display may be used instead of the semiconductor wafer.

By using the method for forming micro lenses in accordance with the present invention, an etching rate, an in-surface uniformity and a lens shape can be controlled by controlling the ratio of the flow rates of two kinds of gases employed as the etching gas.

While the invention has been shown and described with respect to the preferred embodiments, it will be understood by those skilled in the art that various changes and modifications may be made without departing from the spirit and scope of the invention as defined in the following claims.

What is claimed is:

1. A method for forming micro lenses, comprising the step of:

performing an etching treatment on an object to be processed, which includes a lens material layer and a mask layer having lens shapes and formed on the lens material layer, using an etching gas including $SF_6$ gas and CO gas to etch the lens material layer and the mask layer and transfer the lens shapes of the mask layer to the lens material layer, thereby forming the micro lenses.

2. The method of claim 1, wherein the lens material layer is a silicon nitride film.

3. The method of claim 1, wherein the mask layer is a resist film.

4. The method of claim 1, wherein each lens shape of the mask layer has a curved surface.

5. The method of claim 1, wherein each micro lens has a width larger than that of each lens shape of the mask layer.

6. The method of claim 1, wherein the micro lenses are light condensing micro lenses prepared respectively corresponding to a plurality of photosensitive units arranged in a matrix shape in a charge coupled device.

7. The method of claim 6, wherein the micro lenses are arranged in a honeycomb structure.

* * * * *